(12) United States Patent
You et al.

(10) Patent No.: US 9,721,950 B2
(45) Date of Patent: Aug. 1, 2017

(54) SEMICONDUCTOR DEVICE

(71) Applicant: Samsung Electronics Co., Ltd., Suwon-Si, Gyeonggi-do (KR)

(72) Inventors: Jung-Gun You, Anyang-Si (KR); Jae-Chul Kim, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 15/051,860

(22) Filed: Feb. 24, 2016

(65) Prior Publication Data

US 2016/0336315 A1  Nov. 17, 2016

(30) Foreign Application Priority Data

May 11, 2015 (KR) ........................ 10-2015-0065131

(51) Int. Cl.
| | |
|---|---|
| *H01L 27/088* | (2006.01) |
| *H01L 29/78* | (2006.01) |
| *H01L 29/423* | (2006.01) |
| *H01L 29/40* | (2006.01) |
| H01L 21/8234 | (2006.01) |

(52) U.S. Cl.
CPC ........ *H01L 27/0886* (2013.01); *H01L 29/408* (2013.01); *H01L 29/42364* (2013.01); *H01L 29/785* (2013.01); *H01L 21/823431* (2013.01); *H01L 21/823437* (2013.01); *H01L 21/823481* (2013.01)

(58) Field of Classification Search
CPC ............... H01L 27/0886; H01L 29/408; H01L 29/42364; H01L 29/785
See application file for complete search history.

(56) References Cited

U.S. PATENT DOCUMENTS

| | | | | |
|---|---|---|---|---|
| 8,557,666 | B2* | 10/2013 | Wei | H01L 21/76224 257/E21.09 |
| 8,586,436 | B2* | 11/2013 | Ng | H01L 21/823842 257/369 |
| 8,836,046 | B2* | 9/2014 | Maeda | H01L 29/41791 257/368 |
| 8,847,319 | B2* | 9/2014 | Liu | H01L 21/82385 257/355 |
| 8,859,391 | B2* | 10/2014 | Matsugai | H01L 27/1464 257/431 |
| 8,878,309 | B1* | 11/2014 | Hong | H01L 27/0886 257/330 |
| 8,916,460 | B1* | 12/2014 | Kwon | H01L 29/66795 257/192 |
| 9,299,811 | B2* | 3/2016 | Kim | H01L 29/66795 |
| 9,431,537 | B2* | 8/2016 | Maeda | H01L 29/7848 |

(Continued)

*Primary Examiner* — Earl Taylor
(74) *Attorney, Agent, or Firm* — Ward and Smith, P.A.

(57) ABSTRACT

A semiconductor device including fin type patterns is provided. The semiconductor device includes a first fin type pattern, a field insulation layer disposed in vicinity of the first fin type pattern and having a first part and a second part, the first part protruding from the second part, a first dummy gate stack formed on the first part of the field insulation layer and including a first dummy gate insulation layer having a first thickness, and a first gate stack formed on the second part of the field insulation layer to intersect the first fin type pattern and including a first gate insulation layer having a second thickness different from the first thickness.

20 Claims, 19 Drawing Sheets

(56) References Cited

U.S. PATENT DOCUMENTS

| | | | |
|---|---|---|---|
| 2012/0104472 A1* | 5/2012 | Xu | H01L 29/66795 257/288 |
| 2013/0075818 A1* | 3/2013 | Lee | H01L 21/823431 257/347 |
| 2014/0001575 A1* | 1/2014 | Adams | H01L 21/845 257/412 |
| 2014/0151810 A1* | 6/2014 | Maeda | H01L 29/41791 257/365 |
| 2014/0203362 A1* | 7/2014 | Kim | H01L 27/0886 257/347 |
| 2014/0339643 A1* | 11/2014 | Cheng | H01L 21/76224 257/369 |
| 2014/0353763 A1* | 12/2014 | Chung | H01L 21/823431 257/390 |
| 2015/0054089 A1* | 2/2015 | Hong | H01L 27/0886 257/401 |
| 2015/0147860 A1* | 5/2015 | Kim | H01L 29/66795 438/283 |
| 2015/0162331 A1* | 6/2015 | Kang | H01L 22/34 257/48 |
| 2015/0279995 A1* | 10/2015 | Maeda | H01L 29/7848 257/192 |
| 2016/0204264 A1* | 7/2016 | You | H01L 29/7856 257/401 |
| 2016/0218180 A1* | 7/2016 | You | H01L 29/6681 |

\* cited by examiner

1200

1300

SEMICONDUCTOR DEVICE

CROSS-REFERENCE TO RELATED APPLICATION

This application claims priority from Korean Patent Application No. 10-2015-0065131 filed on May 11, 2015 in the Korean Intellectual Property Office, and all the benefits accruing therefrom under 35 U.S.C. 119, the contents of which in its entirety are herein incorporated by reference.

BACKGROUND

The present inventive concept relates to a semiconductor device, and more particularly to a semiconductor device including fin type patterns. As one of scaling techniques for increasing the density of a semiconductor device, a gate all around structure in which a silicon body shaped of a nanowire is formed on a substrate and a gate is formed to surround the silicon body has been proposed.

Since the gate all around structure uses a three-dimensional channel, scaling is easily achieved. In addition, current controlling capability can be improved without increasing a length of the gate. Further, a short channel effect (SCE) in which a potential of a channel region is affected by drain voltage can be effectively suppressed.

SUMMARY

The present inventive concept provides a semiconductor device having improved operating performance by increasing a thickness of a gate insulation layer.

The above and other objects of the present inventive concept will be described in or be apparent from the following description of the example embodiments.

According to an aspect of the present inventive concept, there is provided a semiconductor device including a first fin type pattern, a field insulation layer disposed in vicinity of the first fin type pattern and having a first part and a second part, the first part protruding from the second part, a first dummy gate stack formed on the first part of the field insulation layer and including a first dummy gate insulation layer having a first thickness, and a first gate stack formed on the second part of the field insulation layer to intersect the first fin type pattern and including a first gate insulation layer having a second thickness different from the first thickness.

In some embodiments of the present inventive concept, the first thickness is a thickness of the first dummy gate insulation layer formed along a top surface of the first part of the field insulation layer, and the second thickness is a thickness of the first gate insulation layer formed along a top surface of the first fin type pattern.

In some embodiments of the present inventive concept, the first thickness is greater than the second thickness.

In some embodiments of the present inventive concept, the first dummy gate stack includes a first dummy spacer defining a first trench, the first gate stack includes a first spacer defining a second trench, the first dummy gate insulation layer includes a first dummy interfacial layer formed on a bottom surface of the first trench and a first dummy high-k insulation layer formed on the first dummy interfacial layer along sidewalls and the bottom surface of the first trench, and the first gate insulation layer includes an interfacial layer formed on a bottom surface of the second trench and a high-k insulation layer formed on the interfacial layer along sidewalls and the bottom surface of the second trench.

In some embodiments of the present inventive concept, the first dummy interfacial layer is not formed along the sidewalls of the first trench, the interfacial layer is not formed along the sidewalls of the second trench, and the interfacial layer is not formed along the sidewalls of the second trench, and In some embodiments of the present inventive concept, each of the first dummy interfacial layer and the interfacial layer include silicon oxide.

In some embodiments of the present inventive concept, a thickness of the first dummy high-k insulation layer formed on the bottom surface of the first trench is substantially same as a thickness of the high-k insulation layer formed on the bottom surface of the second trench.

In some embodiments of the present inventive concept, the semiconductor device may further comprise a second dummy gate stack formed on the first part of the field insulation layer, the second dummy gate stack including a second dummy gate insulation layer having a third thickness smaller than the first thickness and a second dummy spacer defining a first trench. The first fin type pattern has a first terminal and a second terminal, the first dummy gate stack is disposed to be adjacent the first terminal of the first fin type pattern, and the second dummy gate stack is disposed to be adjacent the second terminal of the first fin type pattern.

In some embodiments of the present inventive concept, the first thickness and the third thickness are thicknesses of the first dummy gate insulation layer and the second dummy gate insulation layer formed along a top surface of the first part of the field insulation layer.

In some embodiments of the present inventive concept, the first dummy gate stack includes a first dummy spacer defining a second trench, the first dummy gate insulation layer includes a first dummy interfacial layer formed on the bottom surface of the second trench and a first dummy high-k insulation layer formed along sidewalls and the bottom surface of the second trench on the first dummy interfacial layer, and the second dummy gate insulation layer includes a second dummy interfacial layer formed on the bottom surface of the first trench and a second dummy high-k insulation layer formed along sidewalls and the bottom surface of the first trench on the second dummy interfacial layer.

In some embodiments of the present inventive concept, the first dummy interfacial layer is not formed along the sidewalls of the second trench, the second dummy interfacial layer is not formed along the sidewalls of the first trench, and a thickness of the first dummy interfacial layer is greater than a thickness of the second dummy interfacial layer.

In some embodiments of the present inventive concept, the first dummy gate stack includes a first dummy spacer defining a second trench, the first dummy gate insulation layer includes a first dummy interfacial layer formed on the bottom surface of the second trench and a first dummy high-k insulation layer formed along the sidewalls and the bottom surface of the second trench on the first dummy interfacial layer, and the second dummy gate insulation layer includes a second dummy high-k insulation layer making contact with the first part of the field insulation layer and formed along the sidewalls and the bottom surface of the first trench.

In some embodiments of the present inventive concept, the semiconductor device may further comprise a second fin type pattern disposed to be parallel with the first fin type pattern in a lengthwise direction. The field insulation layer is disposed to be adjacent the second fin type pattern, and the first part of the field insulation layer is disposed between the first fin type pattern and the second fin type pattern.

In some embodiments of the present inventive concept, the semiconductor device may further comprise a second gate stack formed on the second part of the field insulation layer to cross the second fin type pattern. The first dummy gate stack is disposed between the first gate stack and the second gate stack, the first dummy gate stack, the first gate stack and the second gate stack extend lengthwise in a first direction, respectively, and the first gate stack, the first dummy gate stack and the second gate stack are sequentially arranged in a second direction different from the first direction.

In some embodiments of the present inventive concept, the first dummy gate stack includes a dummy gate electrode, the first gate stack includes a gate electrode, a top surface of the dummy gate electrode and a top surface of the gate electrode are parallel to each other, and the dummy gate electrode has a smaller height than the gate electrode.

In some embodiments of the present inventive concept, a top surface of the first part of the field insulation layer and a top surface of the first fin type pattern are parallel to each other.

In some embodiments of the present inventive concept, the top surface of the first part of the field insulation layer is higher than the top surface of the first fin type pattern.

In some embodiments of the present inventive concept, the first fin type pattern has long sides and short sides, the first part of the field insulation layer makes contact with the short sides of the first fin type pattern, and the second part of the field insulation layer makes contact with the first fin type pattern.

According to another aspect of the present inventive concept, there is provided a semiconductor device including a first fin type pattern disposed on a first region of a substrate, a second fin type pattern disposed on a second region of the substrate, a field insulation layer disposed in vicinity of the first fin type pattern and the second fin type pattern, the field insulation layer disposed on the first region, having a first part and a second part, and a top surface of the first part positioned higher than a top surface of the second part, a dummy gate stack including a dummy interfacial layer and a dummy high-k insulation layer formed on the dummy interfacial layer, on the first part of the field insulation layer, a first gate stack formed on the second part of the field insulation layer to intersect the first fin type pattern and including a first interfacial layer and a first high-k insulation layer formed on the first interfacial layer, the first interfacial layer having a thickness different from that of the dummy interfacial layer, and a second gate stack formed on the field insulation layer to intersect the second fin type pattern and including a second interfacial layer and a second high-k insulation layer formed on the second interfacial layer, the second interfacial layer having a thickness different from that of the first interfacial layer.

In some embodiments of the present inventive concept, the second interfacial layer has a greater thickness than the first interfacial layer.

In some embodiments of the present inventive concept, the dummy interfacial layer has a greater thickness than the first interfacial layer.

In some embodiments of the present inventive concept, the dummy high-k insulation layer, the first high-k insulation layer and the second high-k insulation layer have substantially the same thickness.

In some embodiments of the present inventive concept, the first gate stack includes a first gate electrode, the second gate stack includes a second gate electrode, and the first gate electrode and the second gate electrode have different widths.

In some embodiments of the present inventive concept, the dummy gate stack includes a dummy gate electrode, and the dummy gate electrode and the first gate electrode have substantially the same width.

In some embodiments of the present inventive concept, a top surface of the first gate electrode is parallel to a top surface of the second gate electrode, and the first gate electrode has a greater height than the second gate electrode.

In some embodiments of the present inventive concept, the first fin type pattern is a silicon fin type pattern. The semiconductor device may further comprise a silicon germanium channel layer between the first fin type pattern and the first gate stack.

In some embodiments of the present inventive concept, the silicon germanium channel layer is formed on a top surface of the first fin type pattern.

In some embodiments of the present inventive concept, the second interfacial layer and the dummy interfacial layer are formed through the same manufacturing process.

In some embodiments of the present inventive concept, each of the dummy interfacial layer, the first interfacial layer and the second interfacial layer include silicon oxide.

According to still another aspect of the present inventive concept, there is provided a semiconductor device including a first fin type pattern disposed on a first region of a substrate, a second fin type pattern disposed on a second region of the substrate and having long sides and short sides, a field insulation layer disposed in vicinity of the first fin type pattern and the second fin type pattern, the field insulation layer having a first part making contact with the short sides of the second fin type pattern and a second part making contact with the long sides of the second fin type pattern, the first part protruding from a top surface of the second part, a dummy gate stack disposed on first part of the field insulation layer and including a dummy interfacial layer, the dummy interfacial layer including silicon oxide, and a first gate stack disposed on the field insulation layer, including a first interfacial layer, intersecting the first fin type pattern and having a different width from the dummy gate stack, wherein the first interfacial layer includes silicon oxide and the first interfacial layer and the dummy interfacial layer have substantially the same thickness.

In some embodiments of the present inventive concept, the first gate stack has a greater width than the dummy gate stack.

In some embodiments of the present inventive concept, the semiconductor device may further comprise a second gate stack formed on the second part of the field insulation layer, including a second interfacial layer and intersecting the second fin type pattern. The second interfacial layer includes silicon oxide and the second interfacial layer and the dummy interfacial layer have different thicknesses.

In some embodiments of the present inventive concept, the second interfacial layer has a smaller thickness than the dummy interfacial layer.

In some embodiments of the present inventive concept, the second gate stack and the dummy gate stack have substantially the same width.

In some embodiments of the present inventive concept, a top surface of the dummy gate stack is parallel to a top surface of the first gate stack, and the dummy gate stack has a greater height than the first gate stack.

According to a further aspect of the present inventive concept, there is provided a semiconductor device including a fin type pattern including a first termination and a second termination, a field insulation layer including a first part and a second part disposed in vicinity of the fin type pattern, the first part having a top surface positioned higher than a top surface of the second part, a first dummy gate stack disposed on the first part of the field insulation layer adjacent the first termination and including a first dummy gate electrode, a second dummy gate stack disposed on the first part of the field insulation layer adjacent the second termination and including a second dummy gate electrode, the second dummy gate electrode and the first dummy gate electrode having different heights, and a gate stack disposed on the second part of the field insulation layer and intersecting the fin type pattern.

In some embodiments of the present inventive concept, the first dummy gate stack includes a first dummy interfacial layer formed along a top surface of the first part of the field insulation layer and a first dummy high-k insulation layer formed on the first dummy interfacial layer, the second dummy gate stack includes a second dummy interfacial layer formed along a top surface of the first part of the field insulation layer and a second dummy high-k insulation layer formed on the second dummy interfacial layer, and the first dummy interfacial layer and the second dummy interfacial layer have different thicknesses.

In some embodiments of the present inventive concept, a thickness of the first dummy high-k insulation layer between the first dummy interfacial layer and the first dummy gate electrode is substantially same as a thickness of the second dummy high-k insulation layer between the second dummy interfacial layer and the second, dummy gate electrode.

In some embodiments of the present inventive concept, the first dummy gate stack includes a first dummy interfacial layer formed along the top surface of the first part of the field insulation layer and a first dummy high-k insulation layer formed on the first dummy interfacial layer, and the second dummy gate stack includes a second dummy high-k insulation layer making contact with the first part of the field insulation layer.

In some embodiments of the present inventive concept, a top surface of the first dummy gate stack, a top surface of the second dummy gate stack and a top surface of the first gate stack are parallel to one another.

Some embodiments of the present inventive concept include a semiconductor device that includes a first fin type pattern on a first region of a substrate, a second fin type pattern on the first region of the substrate that is parallel with the first fin type pattern in a lengthwise direction, and a third fin type pattern on a second region of the substrate. Such embodiments may include a field insulation layer on portions of the first fin type pattern, the second fin type pattern and the third, the field insulation layer being on the first region and the second region, having a first part and a second part that protrudes from the first part and that includes a top surface that is lower than a top surface of the first part, a dummy gate stack including a dummy interfacial layer and a dummy high-k insulation layer on the dummy interfacial layer, on the first part of the field insulation layer, a first gate stack on the second part of the field insulation layer to intersect the first fin type pattern and including a first interfacial layer and a first high-k insulation layer on the first interfacial layer, the first interfacial layer having a thickness that is different from that of the dummy interfacial layer, and a second gate stack on the field insulation layer to intersect the third fin type pattern and including a second interfacial layer and a second high-k insulation layer formed on the second interfacial layer, the second interfacial layer having a thickness that is different from that of the first interfacial layer.

In some embodiments, the second interfacial layer has a greater thickness than the first interfacial layer and the dummy interfacial layer has a greater thickness than the first interfacial layer.

Some embodiments provide that the first gate stack includes a first gate electrode, the second gate stack includes a second gate electrode and that the first gate electrode and the second gate electrode have different widths. In some embodiments, the dummy gate stack includes a dummy gate electrode that includes a width that is substantially the same as a width of the first gate electrode.

Some embodiments provide that the first fin type pattern is a silicon fin type pattern, the semiconductor device further comprising a silicon germanium channel layer between the first fin type pattern and the first gate stack, and the silicon germanium channel layer is formed on a top surface of the first fin type pattern.

In some embodiments, each of the dummy interfacial layer, the first interfacial layer and the second interfacial layer include silicon oxide.

It is noted that aspects of the inventive concept described with respect to one embodiment, may be incorporated in a different embodiment although not specifically described relative thereto. That is, all embodiments and/or features of any embodiment can be combined in any way and/or combination. These and other objects and/or aspects of the present inventive concept are explained in detail in the specification set forth below.

BRIEF DESCRIPTION OF THE DRAWINGS

The above and other features and advantages of the present inventive concept will become more apparent by describing in detail example embodiments thereof with reference to the attached drawings in which.

DETAILED DESCRIPTION

Figure 1:
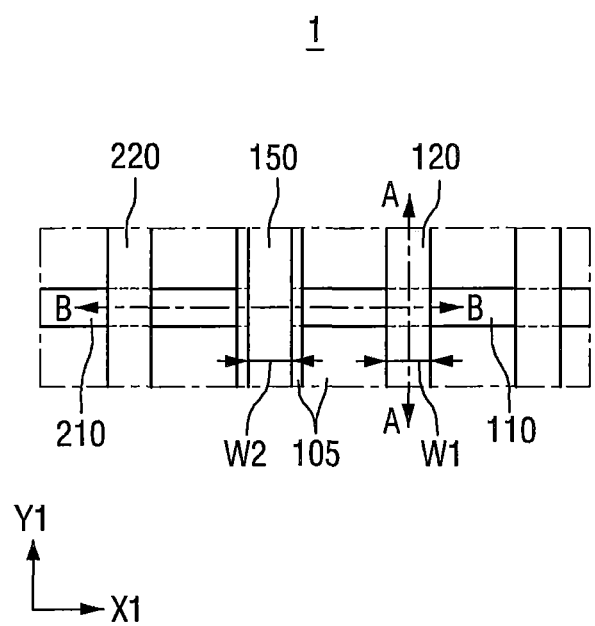
FIGS. 1 and 2 are a layout view and a perspective view for explaining a semiconductor device according to a first embodiment of the present inventive concept.

The present inventive concept will now be described more fully hereinafter with reference to the accompanying drawings, in which example embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. The same reference numbers indicate the same components throughout the specification. In the attached figures, the thickness of layers and regions is exaggerated for clarity.

It will be understood that when an element or layer is referred to as being "connected to," or "coupled to" another element or layer, it can be directly connected to or coupled to another element or layer or intervening elements or layers may be present. In contrast, when an element is referred to as being "directly connected to" or "directly coupled to" another element or layer, there are no intervening elements or layers present. Like numbers refer to like elements throughout. As used herein, the term "and/or" includes any and all combinations of one or more of the associated listed items.

It will also be understood that when a layer is referred to as being "on" another layer or substrate, it can be directly on the other layer or substrate, or intervening layers may also be present. In contrast, when an element is referred to as being "directly on" another element, there are no intervening elements present.

It will be understood that, although the terms first, second, etc. may be used herein to describe various elements, these elements should not be limited by these terms. These terms are only used to distinguish one element from another element. Thus, for example, a first element, a first component or a first section discussed below could be termed a second element, a second component or a second section without departing from the teachings of the present inventive concept.

The use of the terms "a" and "an" and "the" and similar referents in the context of describing the invention (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted.

Unless defined otherwise, all technical and scientific terms used herein have the same meaning as commonly understood by one of ordinary skill in the art to which this invention belongs. It is noted that the use of any and all examples, or example terms provided herein is intended merely to better illuminate the invention and is not a limitation on the scope of the invention unless otherwise specified. Further, unless defined otherwise, all terms defined in generally used dictionaries may not be overly interpreted.

Hereinafter, a semiconductor device according to a first embodiment of the present inventive concept will be described with reference to FIGS. 1 to 5.

Figure 2:
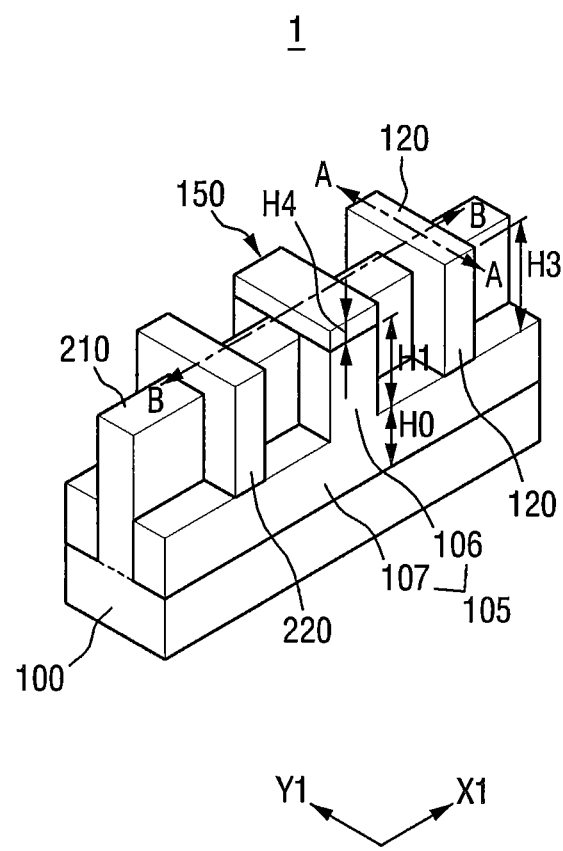
Figure 3:
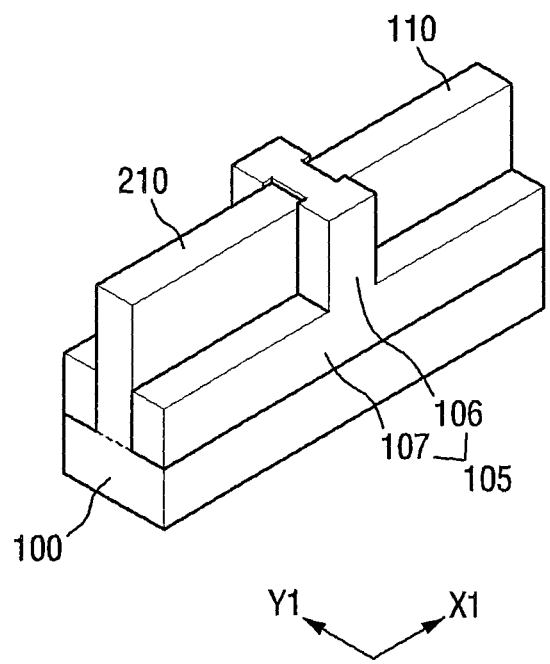
FIG. 3 is a partly perspective view for explaining a fin type pattern and a field insulation layer of the semiconductor device shown in FIGS. 1 and 2.
Figure 4:
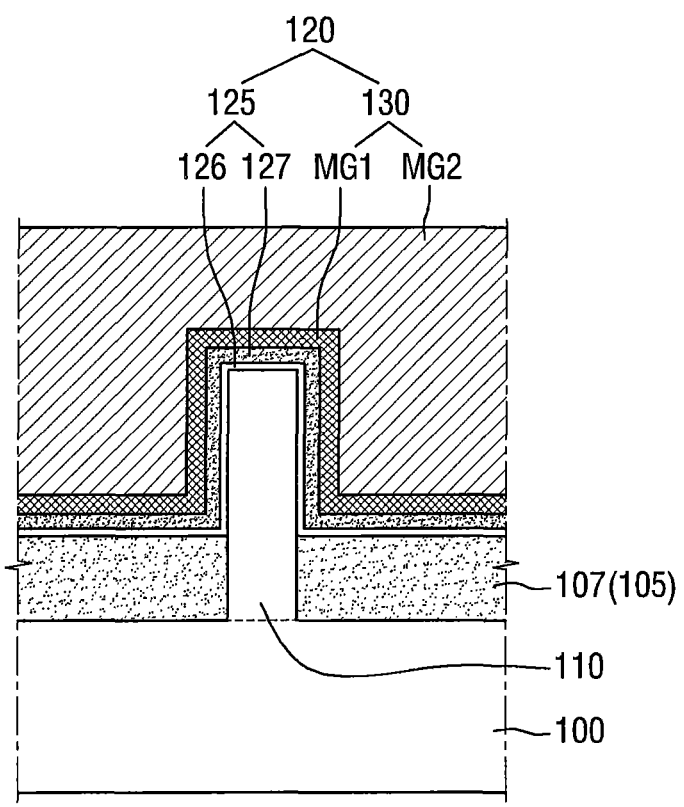
FIG. 4 is a cross-sectional view taken along the line A-A of FIGS. 1 and 2.
Figure 5:
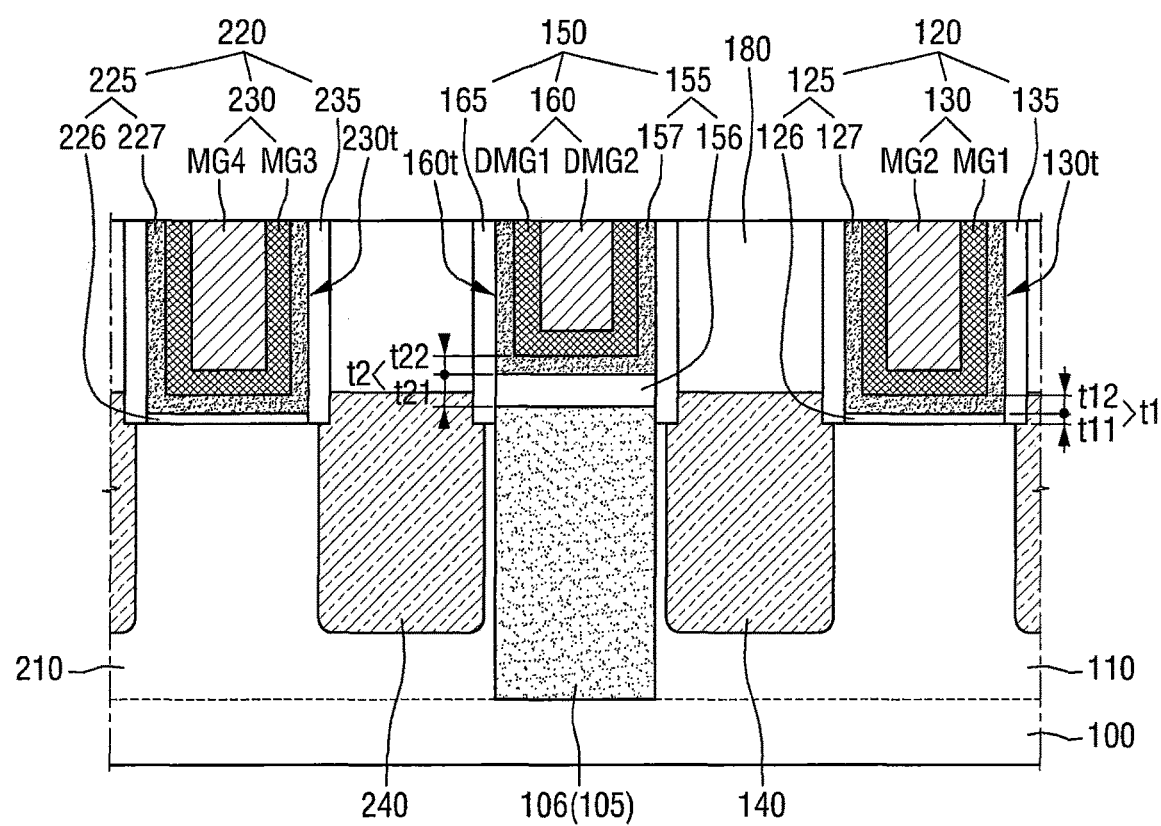
FIG. 5 is a cross-sectional view taken along the line B-B of FIGS. 1 and 2.

FIGS. 1 and 2 are a layout view and a perspective view for explaining a semiconductor device according to a first embodiment of the present inventive concept, FIG. 3 is a partly perspective view for explaining a fin type pattern and a field insulation layer of the semiconductor device shown in FIGS. 1 and 2, FIG. 4 is a cross-sectional view taken along the line A-A of FIGS. 1 and 2, and FIG. 5 is a cross-sectional view taken along the line B-B of FIGS. 1 and 2.

Here, fin type patterns shown in FIGS. 1 to 3 include sources/drains formed thereon.

In addition, while fin type patterns are illustrated in FIGS. 1 to 3 by way example, wire patterns, instead of the fin type patterns may be formed.

Referring to FIGS. 1 to 5, the semiconductor device 1 according to the first embodiment of the present inventive concept may include a first fin type pattern 110, a second fin type pattern 210, a first gate stack 120, a second gate stack 220, and a first dummy gate stack 150.

The substrate 100 may be, for example, bulk silicon or a silicon-on-insulator (SOI). In some embodiments, the substrate 100 may be a silicon substrate, or a substrate made of other materials selected from the group consisting of, for example, germanium, silicon germanium, indium antimonide, lead telluride compound, indium arsenide, indium phosphide, gallium arsenide, and/or gallium antimonide. In addition, the substrate 100 may be an epitaxial layer formed on a base substrate.

The first fin type pattern 110 and the second fin type pattern 210 may protrude from the substrate 100. The first fin type pattern 110 and the second fin type pattern 210 may extend lengthwise in a first direction X1.

The first fin type pattern 110 and the second fin type pattern 210 arranged to be parallel with each other in a lengthwise direction are illustrated, but aspects of the present disclosure are not limited thereto.

Since the first fin type pattern 110 and the second fin type pattern 210 are formed lengthwise along the first direction, they may have long sides extending along the first direction X1 and short sides extending along a second direction Y1, respectively.

Even if the first fin type pattern 110 and the second fin type pattern 210 have rounded corners, it is obvious that those skilled in the art can discriminate between long sides and short sides.

The first fin type pattern 110 and the second fin type pattern 210 may mean active patterns used in a multi-gate transistor. That is to say, each of the first fin type pattern 110 and the second fin type pattern 210 may be formed by connecting channels along three surfaces of each fin or channels may be formed on two opposed surfaces of each fin.

Each of the first fin type pattern 110 and the second fin type pattern 210 may be a portion of the substrate 100 and/or may include an epitaxial layer grown from the substrate 100.

The first fin type pattern 110 and the second fin type pattern 210 may include, for example, an element semiconductor material, such as silicon or germanium. In addition, the first fin type pattern 110 and the second fin type pattern 210 may include a compound semiconductor, such as a group IV-IV compound semiconductor, or a group III-V compound semiconductor.

In detail, the first fin type pattern 110 and the second fin type pattern 210 may include the group IV-IV compound semiconductor, including, for example, a binary compound or a ternary compound, including two or more group IV elements, such as carbon (C), silicon (Si), germanium (Ge), and/or tin (Sn), or a compound prepared by doping a group IV element into the binary or ternary compound.

The first fin type pattern 110 and the second fin type pattern 210 may include the group III-V compound semiconductor, including, for example, a binary compound, a ternary compound or a quaternary compound, prepared by combining at least one group III element of aluminum (Al), gallium (Ga) and/or indium (In) with at least one group V element of phosphorus (P), arsenic (As) and antimony (Sb).

In describing semiconductor devices according to embodiments of the present inventive concept, it is assumed that the first fin type pattern 110 and the second fin type pattern 210 are silicon fin type patterns including silicon.

The field insulation layer 105 may be formed on the substrate 100 and may be disposed in vicinity of the first fin type pattern 110 and the second fin type pattern 210. The field insulation layer 105 may be formed to surround portions of the first fin type pattern 110 and the second fin type pattern 210. That is to say, the first fin type pattern 110 and the second fin type pattern 210 may be defined by the field insulation layer 105.

In detail, the field insulation layer 105 may have a first part 106 and a second part 107 having different heights. A height of the second part 107 of the field insulation layer 105 may be H0 and a height of the first part 106 of the field insulation layer 105 may be H0+H1.

That is to say, a top surface of the first part 106 of the field insulation layer 105 may protrude above a top surface of the second part 107 of the field insulation layer 105. In some embodiments, the first part 106 of the field insulation layer 105 may protrude from the second part 107 of the field insulation layer 105.

In addition, the top surface of the second part 107 of the field insulation layer 105 may be lower than a top surface of the first fin type pattern 110 and a top surface of the second fin type pattern 210.

As shown in FIGS. 2 and 3, in the semiconductor device 1 according to the first embodiment of the present inventive concept, the top surface of the first part 106 of the field insulation layer 105 may be higher than the top surface of the first fin type pattern 110 and the top surface of the second fin type pattern 210.

For example, the first part 106 of the field insulation layer 105 may be formed to make contact with the short sides of the first fin type pattern 110 and the short sides of the second fin type pattern 210. In addition, the second part 107 of the field insulation layer 105 may be formed to make contact with the long sides of the first fin type pattern 110 and the long sides of the second fin type pattern 210.

The first part 106 of the field insulation layer 105 may be formed under the first dummy gate stack 150 and the second part 107 of the field insulation layer 105 may be formed under the first gate stack 120 and the second gate stack 220.

In other words, the first part 106 of the field insulation layer 105 may be disposed between the first fin type pattern 110 and the second fin type pattern 210 facing each other.

The first part 106 of the field insulation layer 105 may be formed to extend lengthwise in a second direction Y1 and the second part 107 of the field insulation layer 105 may be formed to extend lengthwise in a first direction X1.

In addition, the field insulation layer 105 surrounding terminations of the first fin type pattern 110 and the second fin type pattern 210 is illustrated in FIG. 3, but aspects of the present disclosure are not limited thereto.

As shown in FIG. 3, when the field insulation layer 105 is formed to surround the terminations of the first fin type pattern 110 and the second fin type pattern 210, it is possible to prevent the first dummy gate electrode 160 of the first dummy gate stack 150 to be disposed between portions of the field insulation layer 105 from being misaligned.

The field insulation layer 105 may include, for example, an oxide layer, a nitride layer, an oxynitride layer, and/or combinations thereof.

The first gate stack 120 may extend in the second direction Y1 to intersect the first fin type pattern 110. The first gate stack 120 may be disposed on the first fin type pattern 110 and the field insulation layer 105, more specifically on the second part 107 of the field insulation layer 105.

The second gate stack 220 may extend in the second direction Y1 to intersect the second fin type pattern 210. The second gate stack 220 may be disposed on the second fin type pattern 210 and the field insulation layer 105, more specifically on the second part 107 of the field insulation layer 105. The second gate stack 220 may be formed to be parallel to the first gate stack 120.

The first dummy gate stack 150 may extend in the second direction Y1 to then be disposed on a corresponding one of the first parts 106 of the field insulation layer 105. One of the first dummy gate stack 150 may be formed on the corresponding the first parts 106 of the field insulation layer 105.

Since one dummy gate stack, rather than two or more dummy gate stacks, is formed on the first part 106 of the field insulation layer 105, the layout size can be reduced.

The first gate stack 120 may include a first gate electrode 130, a first gate insulation layer 125 and a first spacer 135.

The second gate stack 220 may include a second gate electrode 230, a second gate insulation layer 225 and a second spacer 235.

The first dummy gate stack 150 may include a first dummy gate electrode 160, a first dummy gate insulation layer 155 and a first dummy spacer 165.

In the semiconductor device 1 according to the first embodiment of the present inventive concept, a width w1 of the first gate stack 120 intersecting the first fin type pattern 110 may be substantially equal to a width w2 of the first dummy gate stack 150 disposed on the first part 106 of the field insulation layer 105.

For example, the first gate electrode 130 and the first dummy gate electrode 160 may have substantially the same width.

The first gate electrode 130, the second gate electrode 230 and the first dummy gate electrode 160 may be formed to extend in the second direction Y1, respectively.

The first gate electrode 130 may include metal layers MG1 and MG2. As shown, the first gate electrode 130 may include two or more metal layers MG1 and MG2 stacked one on another. The first metal layer MG1 controls a work function and the second metal layer MG2 may fill a space formed by the first metal layer MG1. The first metal layer MG1 may include, for example, at least one of TiN, WN, TiAl, TiAlN, TaN, TiC, TaC, TaCN, TaSiN and/or combinations thereof, but aspects of the present disclosure are not limited thereto. In addition, the second metal layer MG2 may include, for example, W, Al, Cu, Co, Ti, Ta, poly-Si, SiGe, and/or a metal alloy, but aspects of the present disclosure are not limited thereto.

The first gate electrode 130 may be formed by, for example, a replacement process or a gate last process, but aspects of the present disclosure are not limited thereto.

Like the first gate electrode 130, the second gate electrode 230 may include a third metal gate MG3 and a fourth metal gate MG4. A description of the second gate electrode 230 may be substantially the same as that of the first gate electrode 130.

The first dummy gate electrode 160 may have substantially the same configuration as that of the first gate electrode 130 or the second gate electrode 230. As shown, the first dummy gate electrode 160 may include two or more metal layers DGM1 and DGM2 stacked one on another. The first dummy metal layer DMG1 controls a work function and the second dummy metal layer DMG2 may fill a space formed by the first dummy metal layer DMG1. The first dummy gate electrode 160 and the first gate electrode 130 may include substantially the same material.

As described above in FIG. 2, the first part 106 of the field insulation layer 105 and the second part 107 of the field insulation layer 105 may have different heights. The height of the first part 106 of the field insulation layer 105 may be H0+H1 and the height of the second part 107 of the field insulation layer 105 may be H0.

The top surface of the first part 106 of the field insulation layer 105 may be higher than a bottom surface of the first gate electrode 130 and a bottom surface of the second gate electrode 230.

The first gate electrode 130 and the second gate electrode 230 may be formed along the second part 107 of the field insulation layer 105 and the top surfaces and sidewalls of the first and second fin type patterns 110 and 210. The "bottom surface" of each of the first gate electrode 130 and the second gate electrode 230 may mean the bottommost part of a base of each of the first gate electrode 130 and the second gate electrode 230. In FIG. 2, the bottom surface may be a surface facing the top surface of the second part 107 of the field insulation layer 105.

In other words, each of the first and second gate electrodes 130 and 230 has a first surface facing the top surface of each of the first and second fin type patterns 110 and 210 and a second surface facing sidewalls of the first and second fin type patterns 110 and 210.

As shown in FIG. 2, the bottom surfaces of the first and second gate electrodes 130 and 230 may be formed to be lower than the first surface and to be connected to the second surface.

Meanwhile, the first dummy gate electrode 160 and the first and second gate electrodes 130 and 230 have different heights.

A top surface of the first dummy gate electrode 160 and the top surfaces of the first and second gate electrodes 130 and 230 may be parallel to each other. For example, when the first dummy gate electrode 160 and the first and second gate electrodes 130 and 230 are planarized, the top surface of the first dummy gate electrode 160 may be positioned to be coplanar with the top surfaces of the first and second gate electrodes 130 and 230.

In other words, the top surface of the first dummy gate stack 150 may be parallel to the top surfaces of the first and second gate stacks 120 and 220.

In the semiconductor device 1 according to the first embodiment of the present inventive concept, the top surface of the first part 106 of the field insulation layer 105 is higher than the top surfaces of the first and second fin type patterns 110 and 210. In addition, the first dummy gate electrode 160 is formed on the first part 106 of the field insulation layer 105 and the first and second gate electrodes 130 and 230 are formed on the first and second fin type patterns 110 and 210.

Accordingly, in the cross-sectional view taken along the line B-B of FIG. 1, a height of the first dummy gate electrode 160 is smaller than heights of the first and second gate electrodes 130 and 230.

In addition, in FIG. 2, the first and second gate stacks 120 and 220 are formed on the second part 107 of the field insulation layer 105 and the first dummy gate stack 150 is formed on the first part 106 of the field insulation layer 105. In addition, since the top surface of the first part 106 of the field insulation layer 105 protrudes above the top surface of the second part 107 of the field insulation layer 105, a height H4 of the first dummy gate stack 150 is smaller than a height H3 of each of the first and second gate stacks 120 and 220.

In more detail, the height of the first dummy gate electrode 160 of the first dummy gate stack 150 is smaller than the height of the second gate electrode 230 of the second gate stack 220.

The first gate insulation layer 125 may be formed between the first fin type pattern 110 and the first gate electrode 130. The first gate insulation layer 125 may be formed along a profile of the first fin type pattern 110 protruding above the field insulation layer 105, that is, the second part 107 of the field insulation layer 105. In addition, the first gate insulation layer 125 may be disposed between the first gate electrode 130 and the second part 107 of the field insulation layer 105.

The first gate insulation layer 125 may include a first interfacial layer 126 and a first high-k insulation layer 127. The first high-k insulation layer 127 may be formed on the first interfacial layer 126. In the semiconductor device 1 according to the first embodiment of the present inventive concept, each of the first interfacial layer 126 and the first high-k insulation layer 127 may be formed along the profile of the second part 107 of the field insulation layer 105 and the top surface of the second part 107 of the field insulation layer 105.

The second gate insulation layer 225 may be formed between the second fin type pattern 210 and the second gate electrode 230. The second gate insulation layer 225 may include a second interfacial layer 226 and a second high-k insulation layer 227. The second high-k insulation layer 227 may be formed on the second interfacial layer 226.

A description of the second gate insulation layer 225 may be substantially the same as that of the first gate insulation layer 125.

Each of the first interfacial layer 126 and the second interfacial layer 226 may include, for example, silicon oxide.

Each of the first high-k insulation layer 127 and the second high-k insulation layer 227 may include a high-k material having a higher dielectric constant than silicon oxide. Each of the first high-k insulation layer 127 and the second high-k insulation layer 227 may include, for example, one or more selected from the group consisting of hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and/or lead zinc niobate, but aspects of the present disclosure are not limited thereto.

The first dummy gate insulation layer 155 may be formed between the first part 106 of the field insulation layer 105 and the first dummy gate electrode 160. The first dummy gate insulation layer 155 may be formed along the top surface of the first part 106 of the field insulation layer 105.

The first dummy gate insulation layer 155 may include a first dummy interfacial layer 156 and a first dummy high-k insulation layer 157. The first dummy high-k insulation layer 157 may be formed on the first dummy interfacial layer 156.

The first dummy interfacial layer 156 may include, for example, silicon oxide and the first dummy high-k insulation layer 157 may include substantially the same material as the first high-k insulation layer 127.

The first spacer 135 may be disposed on sidewalls of the first gate electrode 130 extending in the second direction Y1. The first spacer 135 may define a first trench 130t extending in the second direction Y1.

The second spacer 235 may be disposed on sidewalls of the second gate electrode 230 extending in the second direction Y1. The second spacer 235 may define a second trench 230t extending in the second direction Y1.

The first dummy spacer 165 may be disposed on sidewalls of the first dummy gate electrode 160 extending in the second direction Y1. The first dummy spacer 165 may define a third trench 160t extending in the second direction Y1.

Each of the first spacer 135, the second spacer 235 and the first dummy spacer 165 may include, for example, at least one of silicon nitride (SiN), silicon oxynitride (SiON), silicon oxide ($SiO_2$), silicon oxycarbonitride (SiOCN) and/or combinations thereof.

The first interfacial layer 126 may be formed on a bottom surface of the first trench 130t but may not be formed along sidewalls of the first trench 130t. The first high-k insulation layer 127 may be formed along sidewalls of and the bottom surface of the first trench 130t.

The second interfacial layer 226 may be formed on a bottom surface of the second trench 230t but may not be formed along sidewalls of the second trench 230t. The second high-k insulation layer 227 may be formed along sidewalls of and the bottom surface of the second trench 230t.

The first dummy interfacial layer 156 may be formed on a bottom surface of the third trench 160t but may not be formed along sidewalls of the third trench 160t. The first dummy high-k insulation layer 157 may be formed along sidewalls of and the bottom surface of the third trench 160t.

The first source/drain 140 may be disposed between the first gate electrode 130 and the first part 106 of the field insulation layer 105 and may be formed on the first fin type pattern 110. The first source/drain 140 may include an epitaxial layer. The first source/drain 140 may be an elevated source/drain.

The first source/drain 140 may come in contact with the first spacer 135 and the first dummy spacer 165. A top surface of the first source/drain 140 may be higher than heights of bottom surfaces of the first spacer 135 and the first dummy spacer 165.

The second source/drain 240 may be disposed between the second gate electrode 230 and the first part 106 of the field insulation layer 105 and may be formed on the second fin type pattern 210. The second source/drain 240 may include an epitaxial layer. The second source/drain 240 may be an elevated source/drain.

The second source/drain 240 may come in contact with the second spacer 235 and the first dummy spacer 165. A top surface of the second source/drain 240 may be higher than heights of bottom surfaces of the second spacer 235 and the first dummy spacer 165.

The first source/drain 140 and the second source/drain 240 may have the first part 106 of the field insulation layer 105 interposed therebetween.

When the semiconductor device 1 according to the first embodiment of the present inventive concept is a PMOS transistor, each of the first source/drain 140 and the second source/drain 240 may include a compressive stress material. For example, the compressive stress material may be a material having a larger lattice constant than Si, e.g., SiGe. The compressive stress material may improve the mobility of carriers of a channel region by applying compressive stress to the first fin type pattern 110.

Meanwhile, when the semiconductor device 1 according to the first embodiment of the present inventive concept is an NMOS transistor, each of the first source/drain 140 and the second source/drain 240 may include a tensile stress material. For example, when the first fin type pattern 110 and the second fin type pattern 210 include Si, the first source/drain 140 and the second source/drain 240 may include a material having a smaller lattice constant than Si (e.g., SiC). For example, the tensile stress material may improve the mobility of carriers of a channel region by applying tensile stress to the first fin type pattern 110.

An interlayer insulation layer 180 may be formed on the first source/drain 140 and the second source/drain 240. In addition, interlayer insulation layer 180 may be formed to surround the first gate electrode 130, the second gate electrode 230 and the first dummy gate electrode 160.

The interlayer insulation layer 180 may include, for example, at least one of silicon oxide, silicon nitride, silicon oxynitride, and/or a low-k material. The low-k material may include flowable oxide (FOX), Tonen silazene (TOSZ), undoped silicate glass (USG), borosilica glass (BSG), phosphosilica glass (PSG), borophosphor silica glass (BPSG), plasma enhanced tetraethyl orthosilicate (PETEOS), fluoride silicate glass (FSG), carbon doped silicon oxide (CDO), xerogel, aerogel, amorphous fluorinated carbon, organo silicate glass (OSG), parylene, bis-benzocyclobutenes (BCB), SiLK, polyimide, porous polymeric material, and/or combinations thereof, but aspects of the present disclosure are not limited thereto.

Meanwhile, referring to FIG. 5, the first gate insulation layer 125 may have a part formed on the bottom surface of the first trench 130t and a part formed on the sidewall of the first trench 130t. In addition, the first dummy gate insulation layer 155 may have a part formed on the bottom surface of the third trench 160t and a part formed on the sidewall of the third trench 160t.

Thicknesses of the first gate insulation layer 125 and the first dummy gate insulation layer 155 may vary according to whether they are measured based on the part formed on the bottom surfaces of trenches or the part formed on the sidewalls of the trenches.

The following description of embodiments of the present inventive concept will be made on the assumption that the thickness of an insulation layer is based on the part formed on the bottom surface of a trench.

That is to say, the thickness of the first gate insulation layer 125 means a thickness of the part of the first gate insulation layer 125 formed on the bottom surface of the first trench 130t, that is, the part formed along the top surface of the first fin type pattern 110. In addition, the thickness of the first dummy gate insulation layer 155 means a thickness of the part of the first dummy gate insulation layer 155 formed on the bottom surface of the third trench 160t, that is, the part formed along the top surface of the first part 106 of the field insulation layer 105.

The thickness of the first gate insulation layer 125 may be a first thickness t1 and the thickness of the first dummy gate insulation layer 155 may be a second thickness t2. In the semiconductor device 1 according to the first embodiment of the present inventive concept, the thickness t1 of the first gate insulation layer 125 may be different from the thickness t2 of the first dummy gate insulation layer 155.

For example, the thickness t2 of the first dummy gate insulation layer 155 may be greater than the thickness t1 of the first gate insulation layer 125.

In more detail, the thickness t1 of the first gate insulation layer 125 may be a sum of a thickness t11 of the first interfacial layer 126 and a thickness t12 of the first high-k insulation layer 127. In addition, the thickness t2 of the first dummy gate insulation layer 155 may be a sum of a thickness t12 of the first dummy interfacial layer 156 and a thickness t22 of the first dummy high-k insulation layer 157.

In the semiconductor device 1 according to the first embodiment of the present inventive concept, the thickness t11 of the first interfacial layer 126 may be different from a thickness t21 of the first dummy interfacial layer 156. For example, the thickness t21 of the first dummy interfacial layer 156 may be greater than the thickness t11 of the first interfacial layer 126.

However, the thickness t12 of the first high-k insulation layer 127 may be substantially equal to the thickness t22 of the first dummy high-k insulation layer 157.

Figure 6:
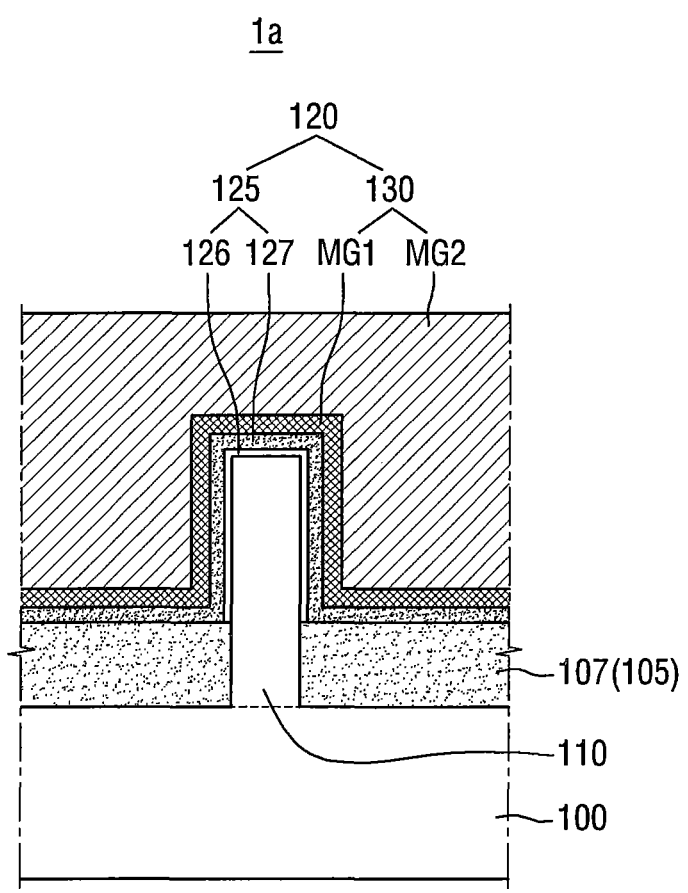
FIG. 6 is a view illustrating a modified example of the semiconductor device according to the first embodiment of the present inventive concept.

FIG. 6 is a view illustrating a modified example of the semiconductor device according to the first embodiment of the present inventive concept. For the sake of convenient explanation, the following description will focus on differences between the semiconductor device shown in FIGS. 1 to 5 and the semiconductor device shown in FIG. 6.

Referring to FIG. 6, in the semiconductor device 1a according to the modified example of the semiconductor device 1 according to the first embodiment of the present inventive concept, the first interfacial layer 126 may be formed along a profile of the first fin type pattern 110 protruding above the field insulation layer 105, that is, the second part 107 of the field insulation layer 105 but may not be formed along the top surface of the second part 107 of the field insulation layer 105.

In other words, the first interfacial layer 126 may not be formed between the first gate electrode 130 and the second part 107 of the field insulation layer 105.

Figure 7:
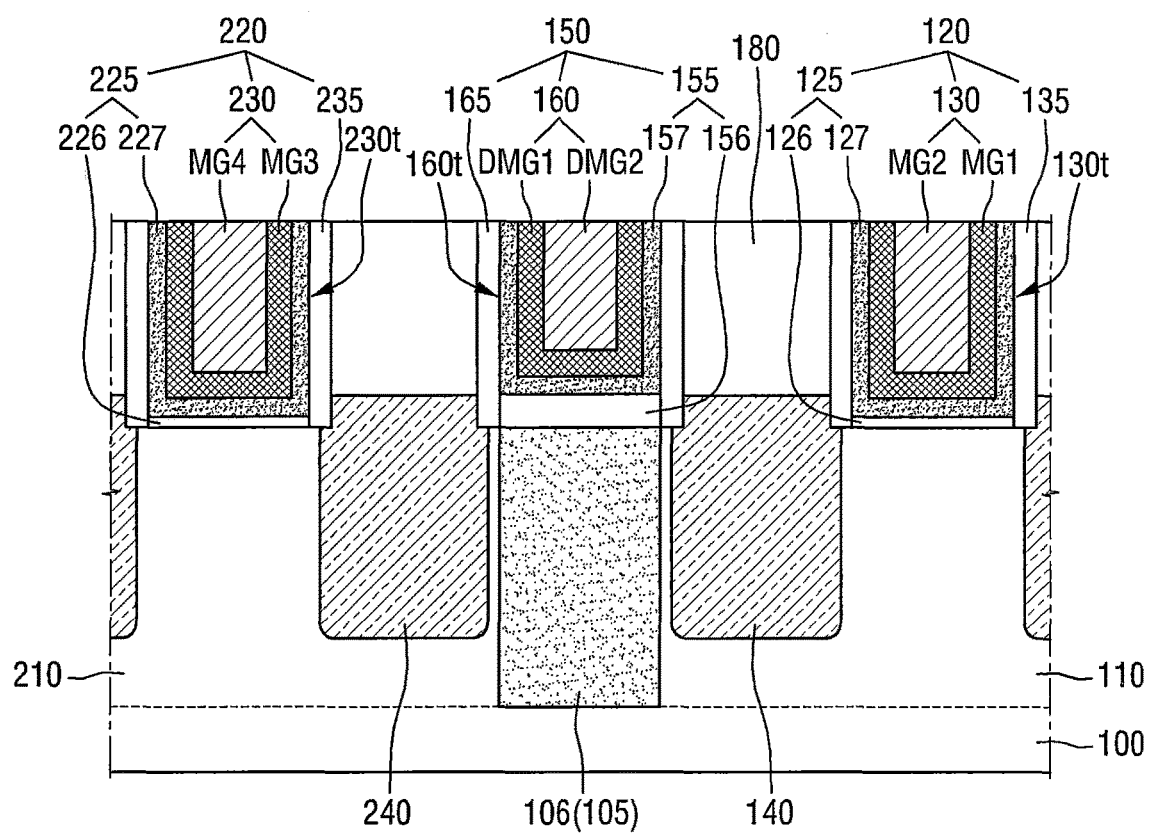
FIG. 7 is a view for explaining a semiconductor device according to a second embodiment of the present inventive concept.

FIG. 7 is a view for explaining a semiconductor device according to a second embodiment of the present inventive concept. For the sake of convenient explanation, the following description will focus on differences between the semiconductor device shown in FIGS. 1 to 5 and the semiconductor device shown in FIG. 7.

Referring to FIG. 7, in the semiconductor device 2 according to the second embodiment of the present inventive concept, a top surface of a first part 106 of a field insulation layer 105 may be parallel to a top surface of a first fin type pattern 110 and a top surface of a second fin type pattern 210.

The first dummy gate electrode 160 is formed on the first part 106 of the field insulation layer 105 and the first and second gate electrodes 130 and 230 are formed on the first and second fin type patterns 110 and 210.

In addition, the top surface of the first part 106 of the field insulation layer 105 may be positioned to be coplanar with the top surfaces of the first and second fin type patterns 110 and 210.

However, a thickness t2 of the first dummy gate insulation layer 155 may be greater than a thickness t1 of the first gate insulation layer 125. Therefore, in the cross-sectional view taken along the line B-B of FIG. 1, a height of the first dummy gate electrode 160 is smaller than heights of the first and second gate electrodes 130 and 230.

Figure 8:
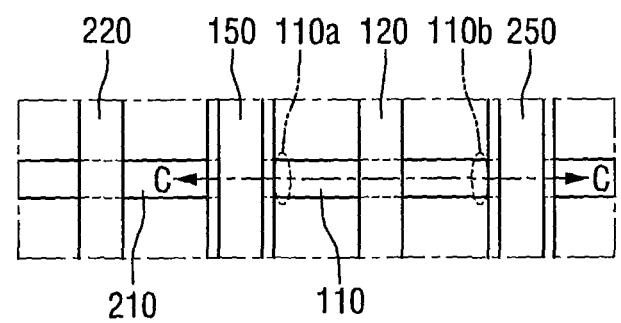
FIG. 8 is a view for explaining a semiconductor device according to a third embodiment of the present inventive concept.
Figure 8:
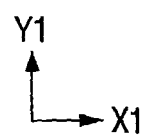
Figure 9:
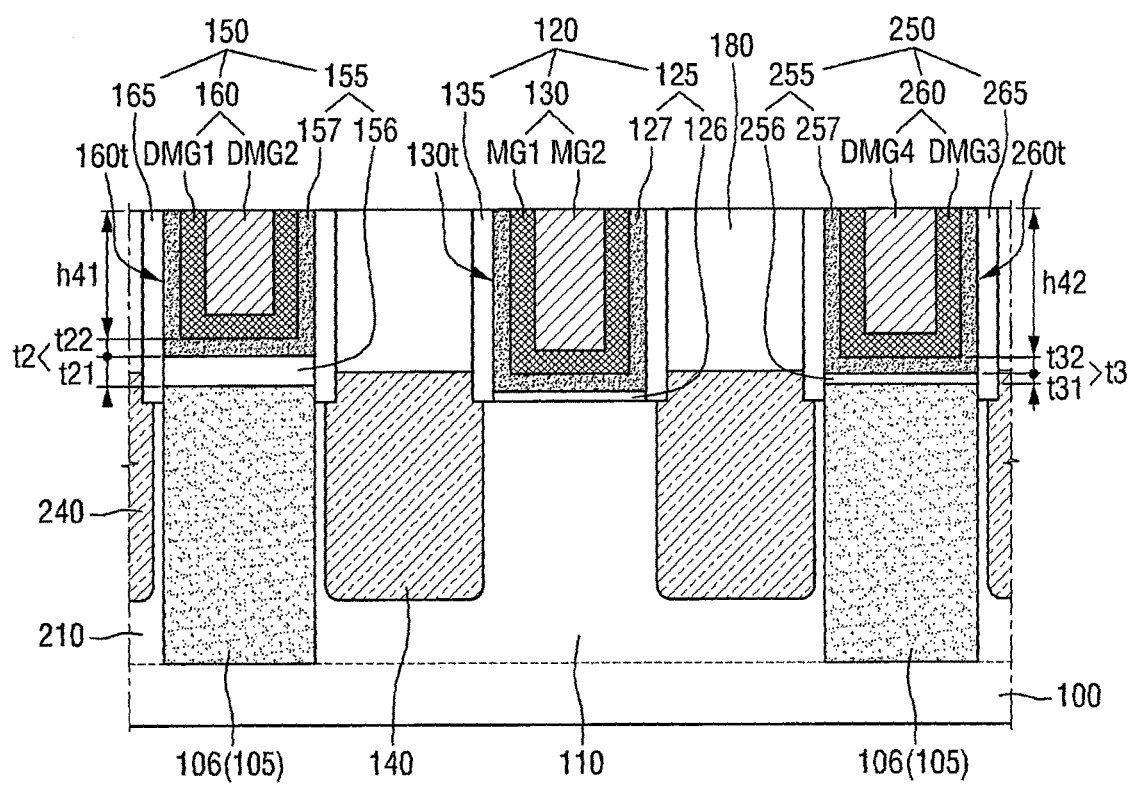
FIG. 9 is a cross-sectional view taken along the line C-C of FIG. 8.

FIG. 8 is a view for explaining a semiconductor device according to a third embodiment of the present inventive concept and FIG. 9 is a cross-sectional view taken along the line C-C of FIG. 8. For the sake of convenient explanation, the following description will focus on differences between the semiconductor device shown in FIGS. 1 to 5 and the semiconductor device shown in FIG. 8.

Referring to FIGS. 8 and 9, the semiconductor device 3 according to the third embodiment of the present inventive concept may further include a second dummy gate stack.

The first fin type pattern 110 includes long sides extending in a first direction X1 and short sides extending in a second direction Y1. Therefore, the first fin type pattern 110 may include a first termination 110a and a second termination 110b having short sides extending in the second direction Y1.

Since first parts 106 of the field insulation layer 105 are formed to make contact with the short sides of the first fin type pattern 110, a first termination 110a of the first fin type pattern 110 and a second termination 110b of the first fin type pattern 110 may come in contact with the first parts 106 of the field insulation layer 105.

In other words, the first fin type pattern 110 may be positioned between the first parts 106 of the field insulation layer 105 extending lengthwise in the second direction Y1.

The first dummy gate stack 150 may be disposed on the first part 106 of the field insulation layer 105 adjacent the first termination 110a of the first fin type pattern 110.

The second dummy gate stack 250 may be disposed on the first part 106 of the field insulation layer 105 adjacent the second termination 110b of the first fin type pattern 110. The second dummy gate stack 250 may extend in the second direction Y1. The second dummy gate stack 250 may be formed on a corresponding one of the first parts 106 of the field insulation layer 105 one by one.

The second dummy gate stack 250 may include a second dummy gate electrode 260, a second dummy gate insulation layer 255 and a second dummy spacer 265.

The first gate stack 120 may be disposed between the first dummy gate stack 150 and the second dummy gate stack 250.

One first gate stack 120 formed between the first dummy gate stack 150 and the second dummy gate stack 250 is illustrated in FIG. 8, which is provided only for the sake of convenient explanation, but aspects of the present disclosure are not limited thereto. That is to say, a plurality of gate stacks may be formed between the first dummy gate stack 150 and the second dummy gate stack 250.

The second dummy gate electrode 260 may be formed to extend in the second direction Y1. The second dummy gate electrode 260 may have substantially the same configuration as the first dummy gate electrode 160.

As shown, the second dummy gate electrode 260 may include two or more metal layers DMG3 and DMG4 stacked one on another. For example, the third dummy metal layer DMG3 controls a work function and the fourth dummy metal layer DMG4 may fill a space formed by the third dummy metal layer DMG3. The second dummy gate electrode 260 and the first gate electrode 130 may include substantially the same material.

A top surface of the first dummy gate electrode 160 and top surfaces of the first gate electrode 130 and the second dummy gate electrode 260 may be parallel to each other. For example, when the first dummy gate electrode 160, the first gate electrode 130 and the second dummy gate electrode 260 are planarized, the top surfaces thereof may be positioned to be coplanar.

In other words, top surfaces of the first dummy gate stack 150, the first gate stack 120 and the second dummy gate stack 250 may be positioned to be coplanar.

The second dummy gate insulation layer 255 may be formed between the first parts 106 of the field insulation layer 105 and the second dummy gate electrode 260. The second dummy gate insulation layer 255 may be formed along top surfaces of the first parts 106 of the field insulation layer 105.

The second dummy gate insulation layer 255 may include a second dummy interfacial layer 256 and a second dummy high-k insulation layer 257. The second dummy high-k insulation layer 257 may be formed on the second dummy interfacial layer 256.

The second dummy interfacial layer 256 may include, for example, silicon oxide and the second dummy high-k insulation layer 257 may include substantially the same material as the first high-k insulation layer 127.

The second dummy spacer 265 may be disposed on sidewalls of the second dummy gate electrode 260 extending in the second direction Y1. The second dummy spacer 265 may define a fourth trench 260t extending in the second direction Y1.

The second dummy spacer 265 may include substantially the same material as the first dummy spacer 165.

The second dummy interfacial layer 256 may be formed on a bottom surface of the fourth trench 260t but may not be formed along sidewalls of the fourth trench 260t. The second dummy high-k insulation layer 257 may be formed along the sidewalls and the bottom surface of the fourth trench 260t.

In the semiconductor device 3 according to the third embodiment of the present inventive concept, a thickness t2 of the first dummy gate insulation layer 155 may be different from a thickness t3 of the second dummy gate insulation layer 255.

For example, the thickness t2 of the first dummy gate insulation layer 155 may be greater than the thickness t3 of the second dummy gate insulation layer 255.

In more detail, the thickness t2 of the first dummy gate insulation layer 155 may be a sum of a thickness t21 of the first dummy interfacial layer 156 and a thickness t22 of the first dummy high-k insulation layer 157. In addition, the thickness t3 of the second dummy gate insulation layer 255 may be a sum of a thickness t31 of the second dummy interfacial layer 256 and a thickness t32 of the second dummy high-k insulation layer 257.

In the semiconductor device 3 according to the third embodiment of the present inventive concept, the thickness t21 of the first dummy interfacial layer 156 may be different from the thickness t31 of the second dummy interfacial layer 256. For example, the thickness t21 of the first dummy interfacial layer 156 may be greater than the thickness t31 of the second dummy interfacial layer 256.

Meanwhile, the thickness t32 of the second dummy high-k insulation layer 257 may be substantially equal to the thickness t22 of the first dummy high-k insulation layer 157.

The first dummy gate stack 150 and the second dummy gate stack 250 may be formed on the corresponding first parts 106 of the field insulation layer 105. In addition, a top surface of the first dummy gate stack 150 and a top surface of the second dummy gate stack 250 may be parallel to each other.

Since the thickness t2 of the first dummy gate insulation layer 155 may be greater than the thickness t3 of the second dummy gate insulation layer 255, a height h41 of the first dummy gate electrode 160 may be smaller than a height h42 of the second dummy gate electrode 260.

Figure 10:
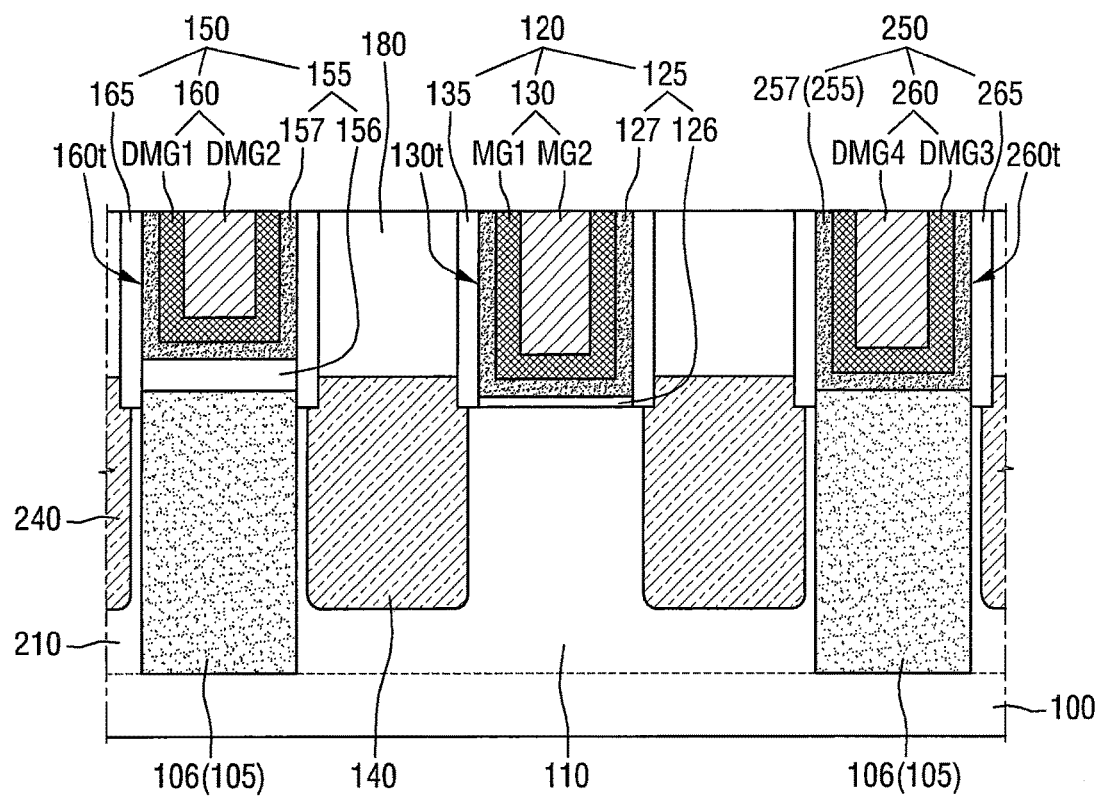
FIG. 10 is a view for explaining a semiconductor device according to a fourth embodiment of the present inventive concept.

FIG. 10 is a view for explaining a semiconductor device according to a fourth embodiment of the present inventive concept. For the sake of convenient explanation, the following description will focus on differences between the semiconductor device shown in FIGS. 8 and 9 and the semiconductor device shown in FIG. 10.

Referring to FIG. 10, in the semiconductor device 4 according to the fourth embodiment of the present inventive concept, a second dummy gate insulation layer 255 may include a second dummy high-k insulation layer 257 but may not include a second dummy interfacial layer 256.

In other words, the second dummy high-k insulation layer 257 formed along a bottom surface and sidewalls of a fourth trench 260t may come in contact with first parts 106 of the field insulation layer 105.

Figure 11:
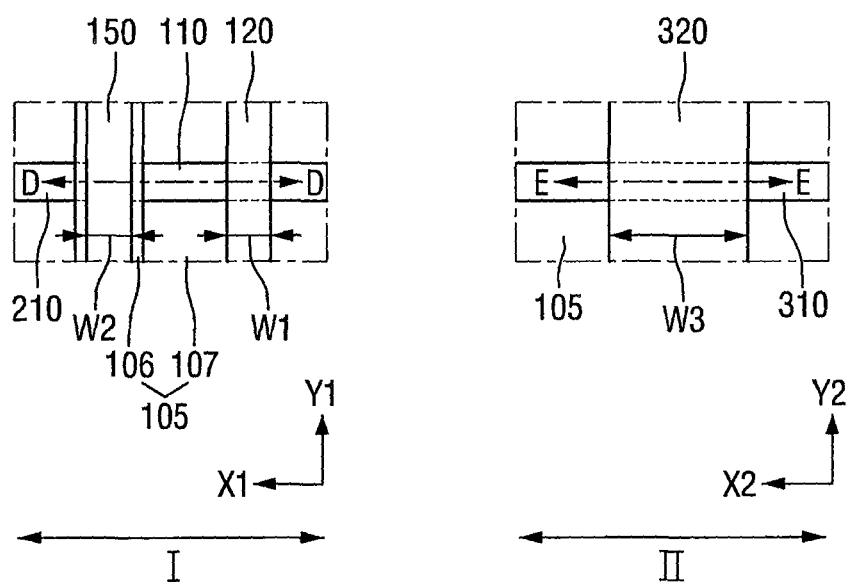
FIGS. 11 and 12 are a layout view and a perspective view for explaining a semiconductor device according to a fifth embodiment of the present inventive concept.
Figure 12:
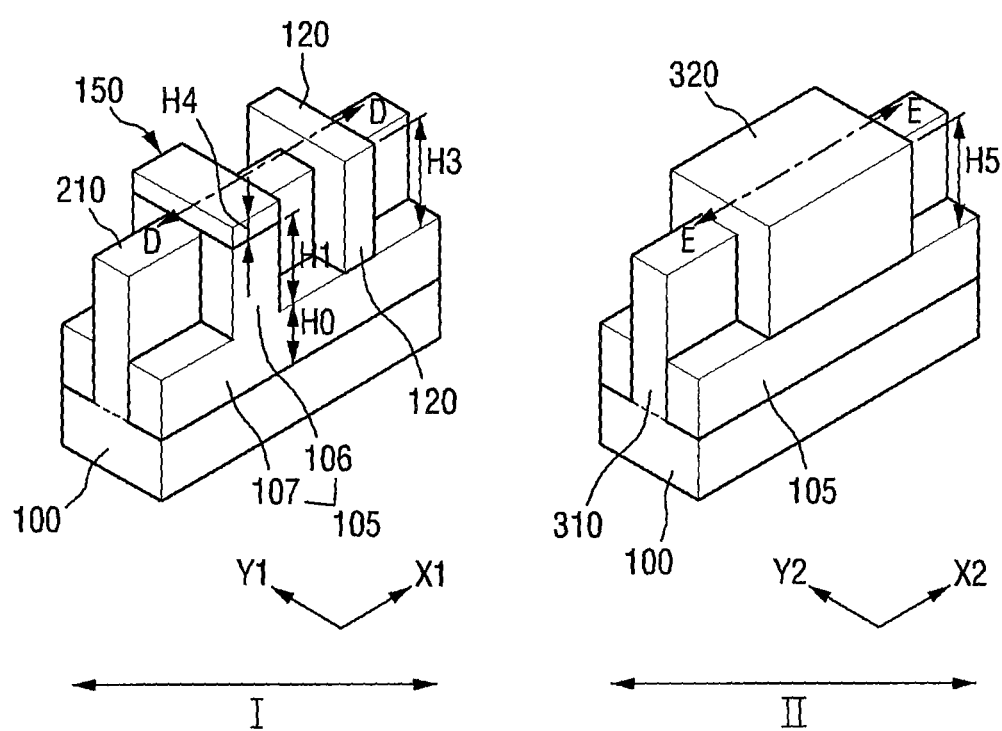
Figure 13:
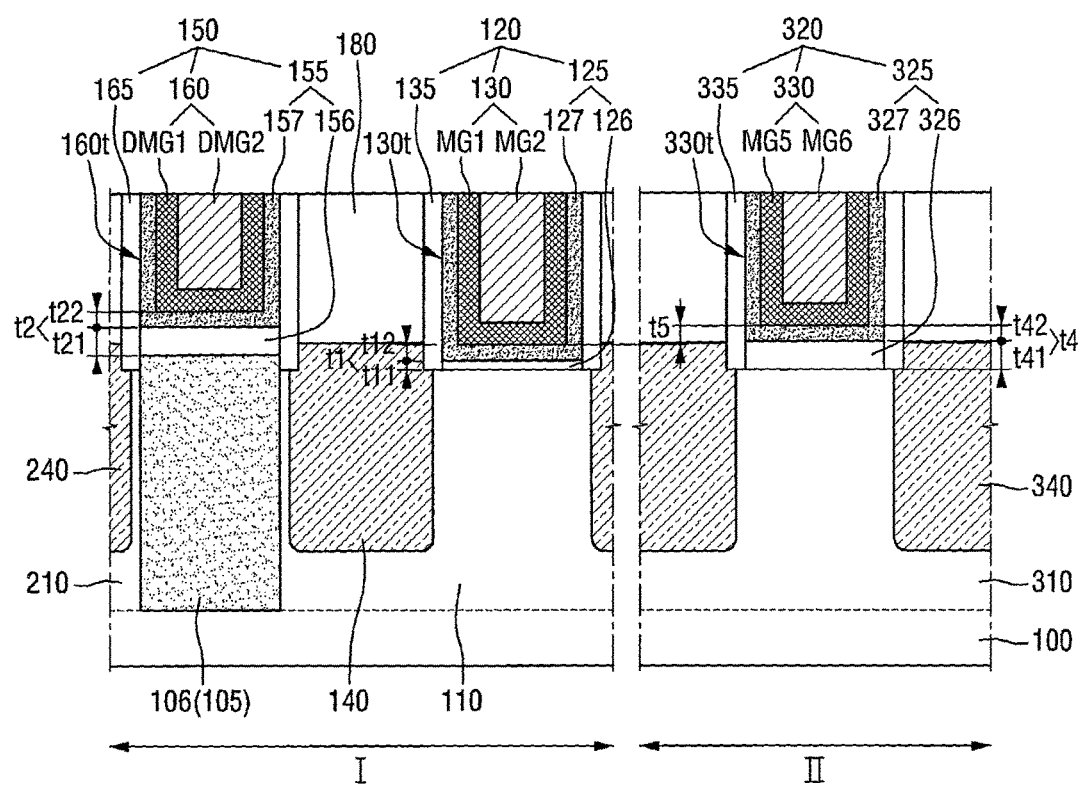
FIG. 13 is a cross-sectional view taken along lines D-D and E-E of FIGS. 11 and 12.

FIGS. 11 and 12 are a layout view and a perspective view for explaining a semiconductor device according to a fifth embodiment of the present inventive concept and FIG. 13 is a cross-sectional view taken along lines D-D and E-E of FIGS. 11 and 12. For the sake of convenient explanation, the following description will focus on differences between the semiconductor device shown in FIGS. 1 to 5 and the semiconductor device shown in FIGS. 11 and 12.

Referring to FIGS. 11 to 13, the semiconductor device 5 according to the fifth embodiment of the present inventive concept may include a first fin type pattern 110, a second fin type pattern 210, a third fin type pattern 310, a first gate stack 120, a third gate stack 320 and a first dummy gate stack 150.

A substrate 100 may include a first region I and a second region II. The first region I and the second region II may be regions separated from each other or connected to each other.

For example, the first region I of the substrate 100 may be a region where a transistor requiring a high-speed operation is formed and the second region II of the substrate 100 may be a region where a transistor requiring a high power level is formed.

The first fin type pattern 110, the second fin type pattern 210, the first dummy gate stack 150 and the first gate stack 120 may be formed on the first region I of the substrate 100.

Since descriptions of the first fin type pattern 110, the second fin type pattern 210, the first dummy gate stack 150 and the first gate stack 120 are substantially the same as described above with reference to FIGS. 1 to 5, repeated descriptions thereof will not be given.

In addition, since a description of the field insulation layer 105 formed on the first region I of the substrate 100 is substantially the same as described above with reference to FIGS. 1 to 5, a repeated description thereof will not be given.

The third fin type pattern 310 may protrude from the substrate 100. The third fin type pattern 310 may extend in a third direction X2.

The third fin type pattern 310 may be a portion of the substrate 100 and/or may include an epitaxial layer grown from the substrate 100.

The third fin type pattern 310 may include, for example, a silicon element semiconductor, such as silicon and/or germanium. In addition, the third fin type pattern 310 may include a compound semiconductor, for example, a group IV-IV compound semiconductor or a group III-V compound semiconductor.

In detail, the third fin type pattern 310 may include, for example, a group IV-IV compound semiconductor, such as a binary compound or a ternary compound including at least two elements of carbon (C), silicon (Si), germanium (Ge), and/or tin (Sn) and/or a compound doped with a IV group element.

In addition, the third fin type pattern 310 may include, for example, a group III-V compound semiconductor, such as a binary compound, a ternary compound or a quaternary compound, prepared by combining at least one group III element of aluminum (Al), gallium (Ga) and/or indium (In) with at least one group V element of phosphorus (P), arsenic (As) and/or antimony (Sb).

The semiconductor devices according to the embodiments of the present inventive concept will be described with regard to a silicon fin type pattern including silicon (Si).

The field insulation layer 105 may be disposed in vicinity of the third fin type pattern 310. The field insulation layer 105 may be formed to surround a portion of the third fin type pattern 310. The third fin type pattern 310 may protrude above a top surface of the field insulation layer 105.

The third gate stack 320 may extend in a fourth direction Y2 to intersect the third fin type pattern 310. The third gate stack 320 may be disposed on the third fin type pattern 310 and the field insulation layer 105.

The third gate stack 320 may include a third gate electrode 330, a third gate insulation layer 325 and a third spacer 335.

In the semiconductor device 5 according to the fifth embodiment of the present inventive concept, a width w3 of the third gate stack 320 may be different from a width w1 of the first gate stack 120 and a width w2 of the first dummy gate stack 150. In addition, the width w1 of the first gate stack 120 may be substantially equal to the width w2 of the first dummy gate stack 150.

For example, the width w3 of the third gate stack 320 may be greater than the width w1 of the first gate stack 120 and the width w2 of the first dummy gate stack 150. In another aspect, a width of the third gate electrode 330 may be greater than a width of the first gate electrode 130 and a width of the first dummy gate electrode 160.

The third gate electrode 330 may extend in the fourth direction Y2. The third gate electrode 330 may include metal layers MG5 and MG6. As shown, the third gate electrode 330 may include two or more metal layers MG5 and MG6 stacked one on another. The fifth metal layer MG5 controls a work function and the sixth metal layer MG6 may fill a space formed by the fifth metal layer MG5. The fifth metal layer MG5 may include, for example, at least one of TiN, WN, TiAl, TiAlN, TaN, TiC, TaC, TaCN, TaSiN and/or combinations thereof, but aspects of the present disclosure are not limited thereto. In addition, the sixth metal layer MG6 may include, for example, W, Al, Cu, Co, Ti, Ta, poly-Si, SiGe, and/or a metal alloy, but aspects of the present disclosure are not limited thereto.

The third gate electrode 330 may be formed by, for example, a replacement process or a gate last process, but aspects of the present disclosure are not limited thereto.

In FIG. 11, the third gate stack 320 is formed on the field insulation layer 105 corresponding to the second part 107 of the field insulation layer 105 formed in the first region I of the substrate 100. Therefore, if a top surface of the first dummy gate stack 150 and a top surface of the third gate stack 320 are parallel to each other, a height 114 of the first dummy gate stack 150 may be smaller than a height H5 of the third gate stack 320.

In more detail, a height of the first dummy gate electrode 160 of the first dummy gate stack 150 is smaller than a height of the third gate electrode 330 of the third gate stack 320.

The third gate insulation layer 325 may include a third interfacial layer 326 and a third high-k insulation layer 327. The third high-k insulation layer 327 may be formed on a third interfacial layer 326. Like in FIG. 4, the third interfacial layer 326 and the third high-k insulation layer 327 may be formed along a profile of the third fin type pattern 310 protruding above the field insulation layer 105 and a top surface of the field insulation layer 105.

The third interfacial layer 326 may include, for example, silicon oxide. The third high-k insulation layer 327 may include a high-k material having a higher dielectric constant than silicon oxide. The third high-k insulation layer 327 may include, for example, one or more selected from the group consisting of hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and/or lead zinc niobate, but aspects of the present disclosure are not limited thereto.

The third spacer 335 may be disposed on sidewalls of the third gate electrode 330 extending in the fourth direction Y2. The third spacer 335 may define a fifth trench 330t extending in the fourth direction Y2.

The third interfacial layer 326 may be formed on a bottom surface of the fifth trench 330t but may not be formed along sidewalls of the fifth trench 330t. The third high-k insulation layer 327 may be formed along the sidewalls and bottom surface of the fifth trench 330t.

The third source/drain 340 may be disposed at opposite sides of the third gate electrode 330 and may be formed on the third fin type pattern 310. The third source/drain 340 may include an epitaxial layer. The third source/drain 340 may be an elevated source/drain.

The thickness of the first gate insulation layer 125 may be a first thickness t1, the thickness of the first dummy gate insulation layer 155 may be a second thickness t2 and the thickness of the third gate insulation layer 325 may be a fourth thickness t4.

In the semiconductor device 5 according to the fifth embodiment of the present inventive concept, the thickness t1 of the first gate insulation layer 125 may be different from the thickness t2 of the first dummy gate insulation layer 155 and the thickness t4 of the third gate insulation layer 325.

For example, the thickness t2 of the first dummy gate insulation layer 155 and the thickness t4 of the third gate insulation layer 325 may be greater than the thickness t1 of the first gate insulation layer 125.

In more detail, the thickness t1 of the first gate insulation layer 125 may be a sum of a thickness t11 of the first interfacial layer 126 and a thickness t12 of the first high-k insulation layer 127 and the thickness t2 of the first dummy gate insulation layer 155 may be a sum of a thickness t21 of the first dummy interfacial layer 156 and a thickness t22 of the first dummy high-k insulation layer 157. In addition, the thickness t4 of the third gate insulation layer 325 may be a sum of a thickness of the third interfacial layer 326 and a thickness t42 of the third high-k insulation layer 327.

In the semiconductor device 5 according to the fifth embodiment of the present inventive concept, a thickness t11 of the first interfacial layer 126 may be different from a thickness t21 of the first dummy interfacial layer 156 and a thickness t41 of the third interfacial layer 326. For example, the thickness t21 of the first dummy interfacial layer 156 and the thickness t41 of the third interfacial layer 326 may be greater than the thickness t11 of the first interfacial layer 126.

In addition, in the semiconductor device 5 according to the fifth embodiment of the present inventive concept, the thickness t21 of the first dummy interfacial layer 156 may be substantially equal to the thickness t41 of the third interfacial layer 326. Since the first dummy interfacial layer 156 and the third interfacial layer 326 are formed through the same manufacturing process, the thickness t21 of the first dummy interfacial layer 156 and the thickness t41 of the third interfacial layer 326 may be substantially equal to each other.

Meanwhile, the thickness t12 of the first high-k insulation layer 127 may be substantially equal to the thickness t22 of the first dummy high-k insulation layer 157 and the thickness t42 of the third high-k insulation layer 327, but aspects of the present disclosure are not limited thereto.

The thickness t1 of the first gate insulation layer 125 may be smaller than the thickness t4 of the third gate insulation layer 325. Therefore, if the top surface of the first gate stack 120 and the top surface of the third gate stack 320 are parallel to each other, a height of the first gate electrode 130 may be a fifth thickness t5 greater than a height of the third gate electrode 330.

Figure 14:
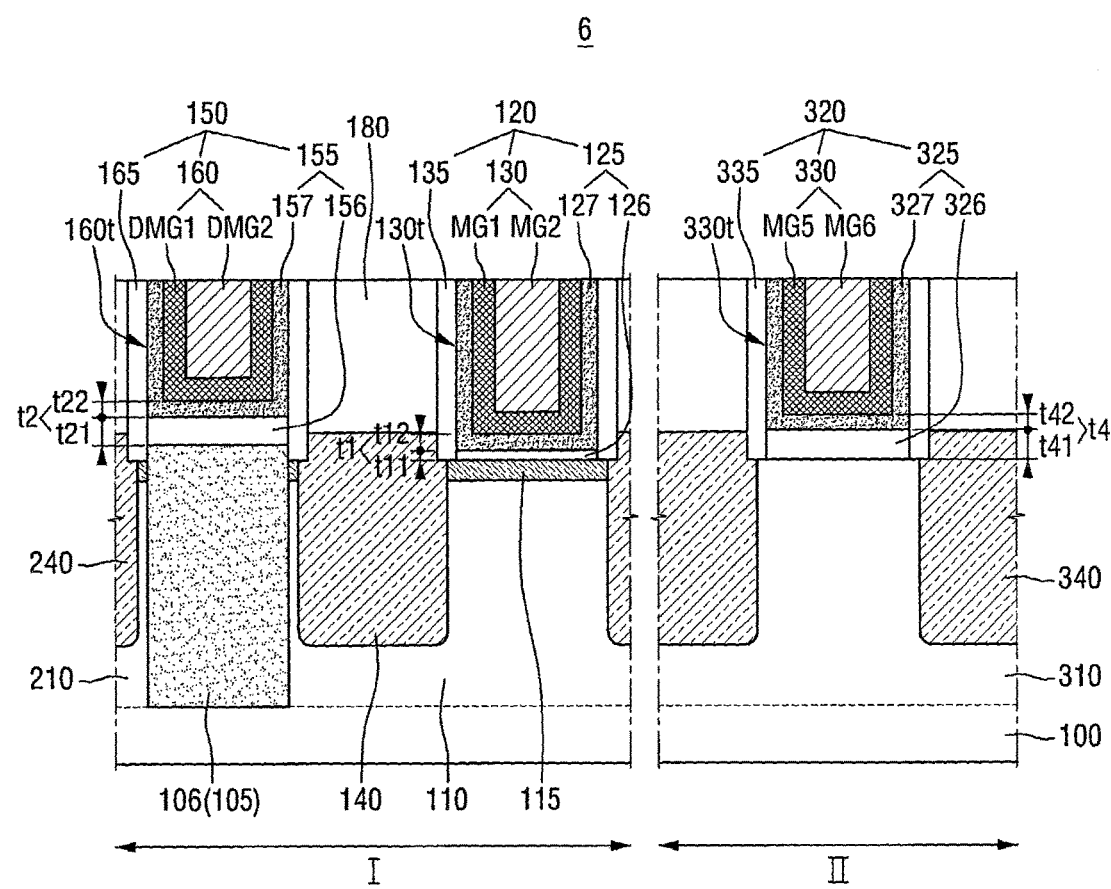
FIG. 14 is a view for explaining a semiconductor device according to a sixth embodiment of the present inventive concept.

FIG. 14 is a view for explaining a semiconductor device according to a sixth embodiment of the present inventive concept. For the sake of convenient explanation, the following description will focus on differences between the semiconductor device shown in FIGS. 11 to 13 and the semiconductor device shown in FIG. 14.

Referring to FIG. 14, the semiconductor device 6 according to the sixth embodiment of the present inventive concept may further include a channel layer 115 formed between the first fin type pattern 110 and the first gate stack 120.

In detail, the channel layer 115 may be formed between the first fin type pattern 110 and the first gate insulation layer 125. For example, the channel layer 115 may be formed on a top surface of the first fin type pattern 110.

The channel layer 115 may include a different material from the first fin type pattern 110. For example, when the first fin type pattern 110 is a silicon fin type pattern, the channel layer 115 may include a material having a larger lattice constant than Si, e.g., SiGe. In other words, the channel layer 115 may be a silicon germanium channel layer.

Figure 15:
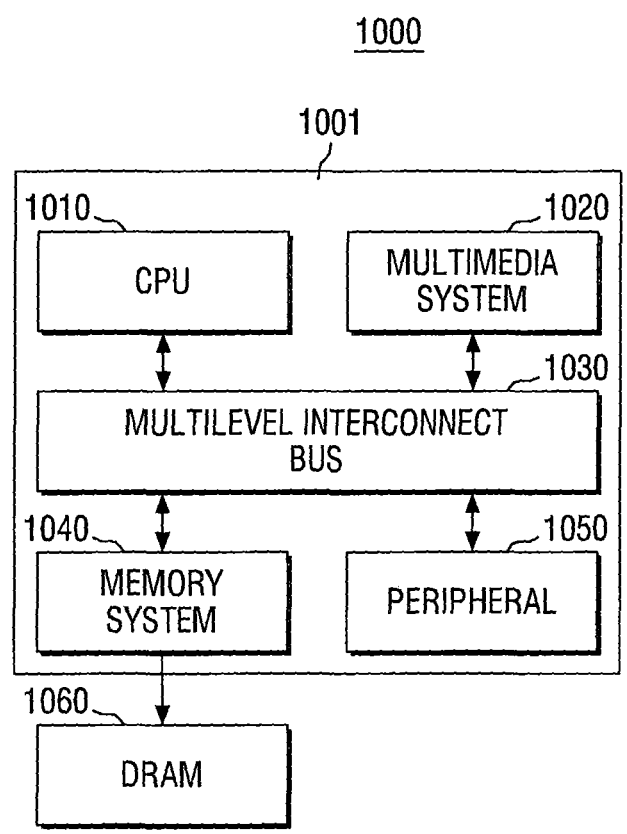
FIG. 15 is a block diagram of an SoC system including semiconductor devices according to some embodiments of the present inventive concept.

FIG. 15 is a block diagram of an SoC system including semiconductor devices according to some embodiments of the present inventive concept.

Referring to FIG. 15, the SoC system 1000 may include an application processor 1001 and a DRAM 1060.

The application processor 1001 may include a central processing unit (CPU) 1010, a multimedia system 1020, a multilevel interconnect bus 1030, a memory system 1040, and a peripheral circuit 1050.

The CPU 1010 may perform arithmetic operations necessary for operating the SoC system 1000. In some embodiments of the present inventive concept, the CPU 1010 may be configured in a multi-core environment including a plurality of cores.

The multimedia system 1020 may be used in performing a variety of multimedia functions in the SoC system 1000. The multimedia system 1020 may include a 3D engine module, a video codec, a display system, a camera system, and a post-processor.

The multilevel interconnect bus 1030 may be used in performing data communication among the CPU 1010, the multimedia system 1020, the memory system 1040, and the peripheral circuit 1050. In some embodiments of the present inventive concept, the multilevel interconnect bus 1030 may have a multi-layered structure. In detail, examples of the bus 1030 may include a multi-layer advanced high-performance bus (AHB), or a multi-layer advanced eXtensible interface (AXI), but aspects of the present disclosure are not limited thereto.

The memory system 1040 may provide environments for high-speed operation by connecting the application processor 1001 to an external memory (for example, the DRAM 1060). In some embodiments of the present inventive concept, the memory system 1040 may include a separate controller (for example, a DRAM controller) for controlling the external memory (for example, the DRAM 1060).

The peripheral circuit 1050 may provide environments for smoothly connecting the SoC system 1000 to an external device (for example, a main board). Accordingly, the peripheral circuit 1050 may include various kinds of interfaces enabling the external device connected to the SoC system 1000 to be compatibly used.

The DRAM 1060 may function as a working memory required to operate the application processor 1001. In some embodiments of the present inventive concept, as illustrated, the DRAM 1060 may be disposed outside the application processor 1001. In detail, the DRAM 1060 may be packaged with the application processor 1001 in the form of a package on package (PoP).

At least one of components of the SoC system 1000 may employ one of the aforementioned semiconductor devices 1 to 6 according to embodiments of the present inventive concept.

Figure 16:
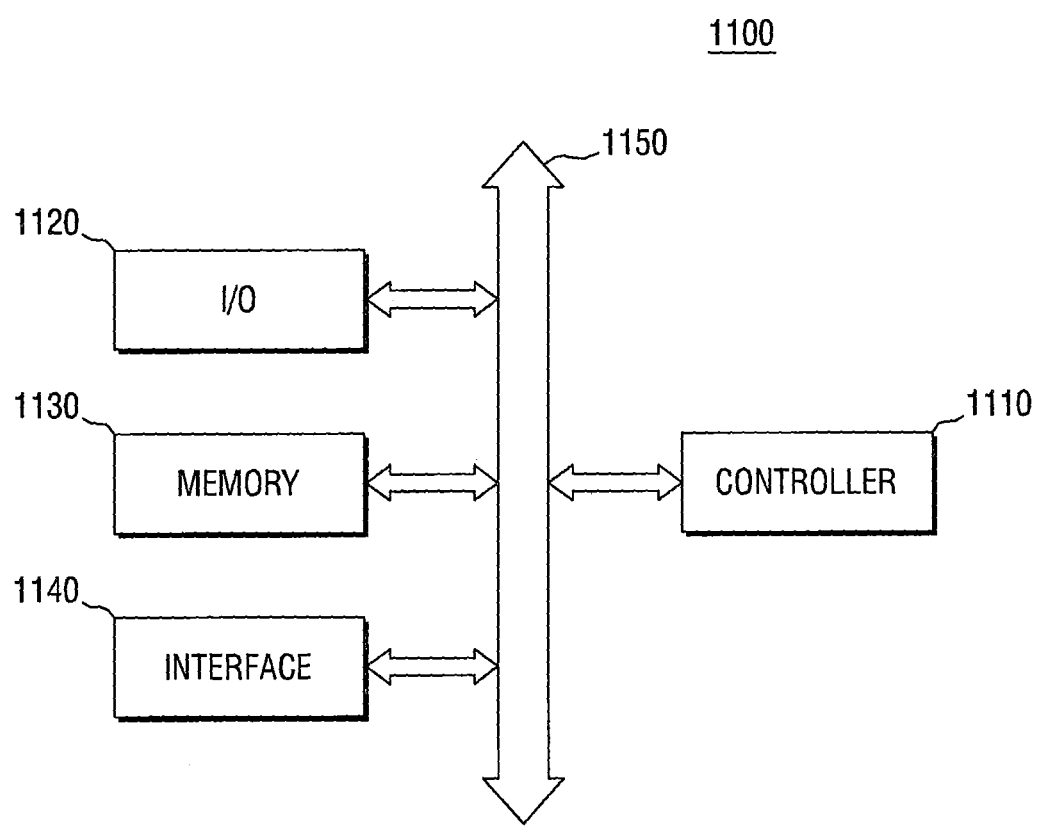
FIG. 16 is a block diagram of an electronic system including semiconductor devices according to some embodiments of the present inventive concept.

FIG. 16 is a block diagram of an electronic system including semiconductor devices according to some embodiments of the present inventive concept.

Referring to FIG. 16, the electronic system 1100 may include a controller 1110, an input/output device (I/O) 1120, a memory device 1130, an interface 1140 and a bus 1150. The controller 1110, the I/O 1120, the memory device 1130, and/or the interface 1140 may be connected to each other through the bus 1150. The bus 1150 corresponds to a path through which data moves.

The controller 1110 may include at least one of a microprocessor, a digital signal processor, a microcontroller, and/or logic elements capable of functions similar to those of these elements. The I/O 1120 may include a key pad, a key board, a display device, and so on. The memory device 1130 may store data and/or commands. The interface 1140 may perform functions of transmitting data to a communication network or receiving data from the communication network. The interface 1140 may be wired or wireless. For example, the interface 1140 may include an antenna or a wired/wireless transceiver, and so on.

Although not illustrated, the electronic system 1100 may further include high-speed DRAM and/or SRAM as the working memory for improving the operation of the controller 1110.

In addition, the aforementioned semiconductor devices according to the embodiments of the present inventive concept may be provided in the memory device 1130 or may be provided some components of the controller 1110 or the I/O 1120.

The electronic system 1100 may be applied to a personal digital assistant (PDA), a portable computer, a web tablet, a wireless phone, a mobile phone, a digital music player, a memory card, and/or any type of electronic device capable of transmitting and/or receiving information in a wireless environment.

Figure 17:
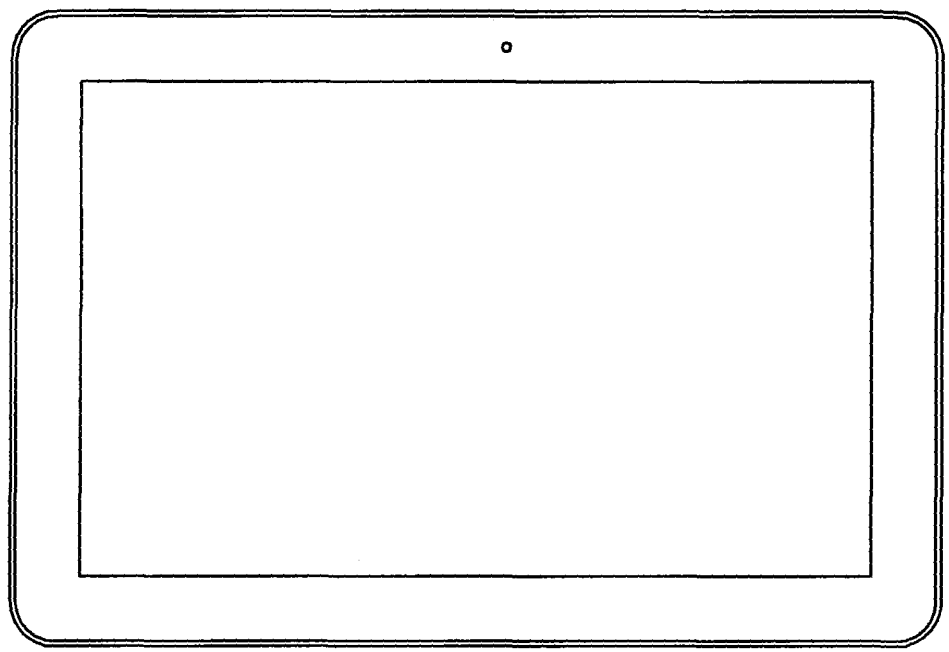
FIGS. 17 to 19 illustrate example semiconductor systems to which semiconductor devices according to some embodiments of the present inventive concept can be applied.
Figure 18:
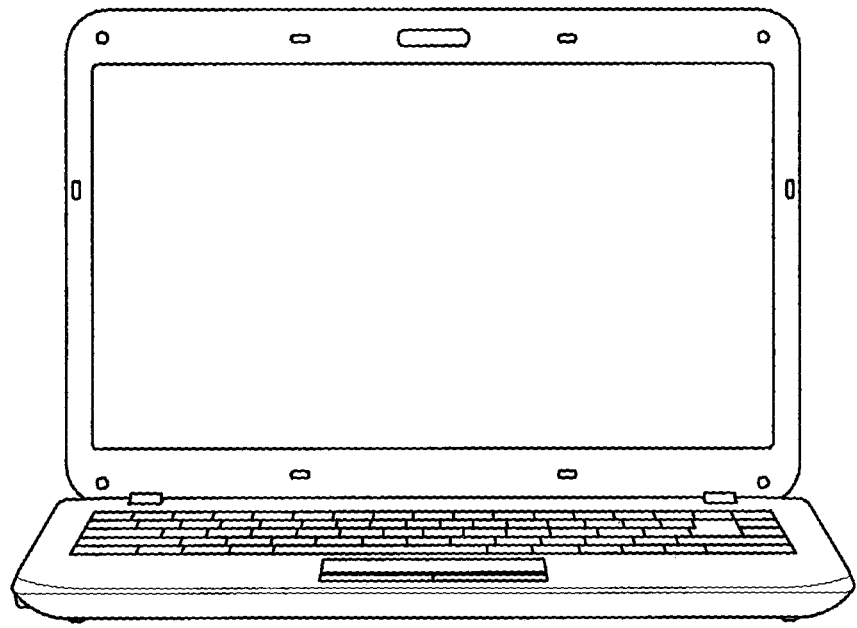
Figure 19:
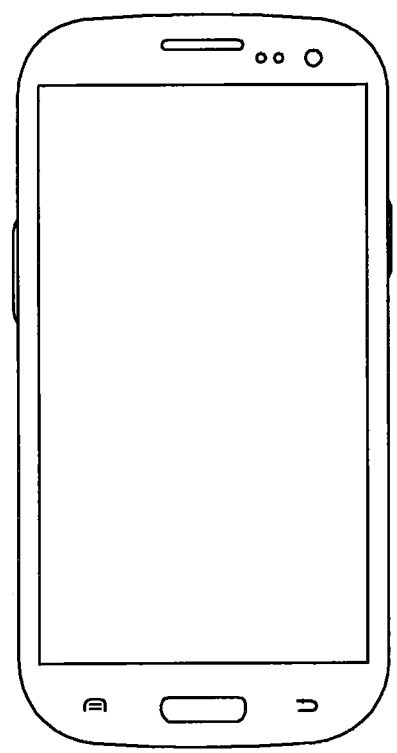

FIGS. 17 to 19 illustrate example semiconductor systems to which semiconductor devices according to some embodiments of the present inventive concept can be applied.

FIG. 17 illustrates an example in which a semiconductor device according to an embodiment of the present inventive concept is applied to a tablet PC (1200), FIG. 18 illustrates an example in which a semiconductor device according to an embodiment of the present inventive concept is applied to a notebook computer (1300), and FIG. 19 illustrates an example in which a semiconductor device according to an embodiment of the present inventive concept is applied to a smart phone (1400). At least one of the semiconductor devices according to some embodiments of the present inventive concept can be employed to a tablet PC 1200, a notebook computer 1300, a smart phone 1400, and the like.

In addition, it is obvious to one skilled in the art that the semiconductor devices 1 to 9 according to some embodiments of the present inventive concept may also be applied to other IC devices not illustrated herein.

That is to say, in the above-described embodiments, only the tablet PC 1200, the notebook computer 1300 and the smart phone 1400 have been exemplified as the semiconductor systems according to the embodiments of the present inventive concept, but aspects of the present disclosure are not limited thereto.

In some embodiments of the present inventive concept, the semiconductor system may be implemented as a computer, an ultra mobile personal computer (UMPC), a work station, a net-book, a personal digital assistant (PDA), a portable computer, a wireless phone, a mobile phone, an e-book, a portable multimedia player (PMP), a potable game console, a navigation device, a black box, a digital camera, a 3-dimensional (3D) television, a digital audio recorder, a digital audio player, a digital picture recorder, a digital picture player, a digital video recorder, a digital video player, or the like.

While the present inventive concept has been particularly shown and described with reference to example embodiments thereof, it will be understood by those of ordinary skill in the art that various changes in form and details may be made therein without departing from the spirit and scope of the present inventive concept as defined by the following claims. It is therefore desired that the present embodiments be considered in all respects as illustrative and not restrictive, reference being made to the appended claims rather than the foregoing description to indicate the scope of the invention.

What is claimed is:

1. A semiconductor device comprising:
a first fin type pattern;
a field insulation layer on portions of the first fin type pattern and having a first part and a second part, the first part protruding from the second part;
a first dummy gate stack on the first part of the field insulation layer and including a first dummy gate insulation layer having a first thickness; and
a first gate stack on the second part of the field insulation layer, the first gate stack intersecting the first fin type pattern and including a first gate insulation layer having a second thickness that is different from the first thickness.

2. The semiconductor device of claim 1, wherein the first thickness is a thickness of the first dummy gate insulation layer along a top surface of the first part of the field insulation layer, and
the second thickness is a thickness of the first gate insulation layer along a top surface of the first fin type pattern.

3. The semiconductor device of claim 2, wherein the first thickness is greater than the second thickness.

4. The semiconductor device of claim 1, wherein the first dummy gate stack includes a first dummy spacer defining a first trench,
the first gate stack includes a first spacer defining a second trench,
the first dummy gate insulation layer includes a first dummy interfacial layer on a bottom surface of the first trench and a first dummy high-k insulation layer on the first dummy interfacial layer along sidewalls and the bottom surface of the first trench, and
the first gate insulation layer includes an interfacial layer on a bottom surface of the second trench and a high-k insulation layer on the interfacial layer along sidewalls and the bottom surface of the second trench.

5. The semiconductor device of claim 4, wherein the first dummy interfacial layer is not along the sidewalls of the first trench,
the interfacial layer is not along the sidewalls of the second trench, and
a thickness of the first dummy interfacial layer is greater than that of the interfacial layer.

6. The semiconductor device of claim 1, further comprising a second dummy gate stack on the first part of the field insulation layer, the second dummy gate stack including a second dummy gate insulation layer having a third thickness that is smaller than the first thickness and a second dummy spacer defining a first trench,
wherein the first fin type pattern has a first terminal and a second terminal,
the first dummy gate stack is adjacent the first terminal of the first fin type pattern, and
the second dummy gate stack is adjacent the second terminal of the first fin type pattern.

7. The semiconductor device of claim 6, wherein the first dummy gate stack includes a first dummy spacer defining a second trench,
the first dummy gate insulation layer includes a first dummy interfacial layer on a bottom surface of the second trench and a first dummy high-k insulation layer along sidewalls and the bottom surface of the second trench on the first dummy interfacial layer, and
the second dummy gate insulation layer includes a second dummy interfacial layer on a bottom surface of the first trench and a second dummy high-k insulation layer along sidewalls and the bottom surface of the first trench on the second dummy interfacial layer.

8. The semiconductor device of claim 7, wherein the first dummy interfacial layer is not along the sidewalls of the second trench,
the second dummy interfacial layer is not along the sidewalls of the first trench, and
a thickness of the first dummy interfacial layer is greater than a thickness of the second dummy interfacial layer.

9. The semiconductor device of claim 6, wherein the first dummy gate stack includes a first dummy spacer defining a second trench,
the first dummy gate insulation layer includes a first dummy interfacial layer on a bottom surface of the second trench and a first dummy high-k insulation layer along sidewalls and the bottom surface of the second trench on the first dummy interfacial layer, and the second dummy gate insulation layer includes a second dummy high-k insulation layer that is along sidewalls and a bottom surface of the first trench and that makes contact with the first part of the field insulation layer.

10. The semiconductor device of claim 1, further comprising a second fin type pattern that is parallel with the first fin type pattern in a lengthwise direction, wherein the field insulation layer is adjacent the second fin type pattern, and the first part of the field insulation layer is disposed between the first fin type pattern and the second fin type pattern.

11. A semiconductor device comprising:

a first fin type pattern on a first region of a substrate;

a second fin type pattern on a second region of the substrate;

a field insulation layer on a portion of the first fin type pattern and a portion of the second fin type pattern, the field insulation layer on the first region having a first part and a second part, and a top surface of the first part positioned higher than a top surface of the second part;

a dummy gate stack including a dummy interfacial layer and a dummy high-k insulation layer on the dummy interfacial layer, on the first part of the field insulation layer;

a first gate stack on the second part of the field insulation layer to intersect the first fin type pattern and including a first interfacial layer and a first high-k insulation layer on the first interfacial layer, the first interfacial layer having a thickness different from that of the dummy interfacial layer; and a second gate stack on the field insulation layer to intersect the second fin type pattern and including a second interfacial layer and a second high-k insulation layer on the second interfacial layer, the second interfacial layer having a thickness different from that of the first interfacial layer.

12. The semiconductor device of claim 11, wherein the second interfacial layer has a greater thickness than the first interfacial layer.

13. The semiconductor device of claim 11, wherein the dummy interfacial layer has a greater thickness than the first interfacial layer.

14. The semiconductor device of claim 11, wherein the first gate stack includes a first gate electrode, the second gate stack includes a second gate electrode, and the first gate electrode and the second gate electrode have different widths.

15. The semiconductor device of claim 14, wherein the dummy gate stack includes a dummy gate electrode, and the dummy gate electrode and the first gate electrode have substantially the same width.

16. The semiconductor device of claim 14, wherein a top surface of the first gate electrode is parallel to a top surface of the second gate electrode, and the first gate electrode has a greater height than the second gate electrode.

17. A semiconductor device comprising:

a first fin type pattern on a first region of a substrate;

a second fin type pattern on the first region of the substrate that is parallel with the first fin type pattern in a lengthwise direction;

a third fin type pattern on a second region of the substrate;

a field insulation layer on portions of the first fin type pattern, the second fin type pattern and the third fin type pattern, the field insulation layer being on the first region and the second region, having a first part and a second part that protrudes from the first part and that includes a top surface that is lower than a top surface of the first part;

a dummy gate stack including a dummy interfacial layer and a dummy high-k insulation layer on the dummy interfacial layer, on the first part of the field insulation layer;

a first gate stack on the second part of the field insulation layer to intersect the first fin type pattern and including a first interfacial layer and a first high-k insulation layer on the first interfacial layer, the first interfacial layer having a thickness that is different from that of the dummy interfacial layer; and a second gate stack on the field insulation layer to intersect the third fin type pattern and including a second interfacial layer and a second high-k insulation layer on the second interfacial layer, the second interfacial layer having a thickness that is different from that of the first interfacial layer.

18. The semiconductor device of claim 17, wherein the second interfacial layer has a greater thickness than the first interfacial layer and the dummy interfacial layer has a greater thickness than the first interfacial layer.

19. The semiconductor device of claim 17, wherein the first gate stack includes a first gate electrode, the second gate stack includes a second gate electrode, wherein the first gate electrode and the second gate electrode have different widths, wherein the dummy gate stack includes a dummy gate electrode that includes a width that is substantially the same as a width of the first gate electrode.

20. The semiconductor device of claim 17, wherein each of the dummy interfacial layer, the first interfacial layer and the second interfacial layer include silicon oxide.

* * * * *